(12) United States Patent
Kato et al.

(10) Patent No.: US 6,545,941 B2
(45) Date of Patent: Apr. 8, 2003

(54) CLOCK SYNCHRONOUS CIRCUIT

(75) Inventors: Koji Kato, Fujisawa (JP); Shigeo Ohshima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/966,664

(22) Filed: Sep. 27, 2001

(65) Prior Publication Data

US 2002/0039326 A1 Apr. 4, 2002

(30) Foreign Application Priority Data

Sep. 28, 2000 (JP) ........................................ 2000-297449

(51) Int. Cl.[7] ................................................. G11C 8/00
(52) U.S. Cl. ....................................... 365/233; 365/194
(58) Field of Search ................................. 365/233, 194

(56) References Cited

U.S. PATENT DOCUMENTS 5,867,432 A    2/1999  Toda
6,292,412 B1 * 9/2001  Kato et al. ................. 365/233
2001/0002799 A1 * 6/2001  Saeki ......................... 327/292
2001/0054926 A1 * 12/2001 Minami et al. ............. 327/277

* cited by examiner

*Primary Examiner*—Huan Hoang
(74) *Attorney, Agent, or Firm*—Hogan & Hartson, LLP

(57) ABSTRACT

A clock synchronous circuit is stopped or started in accordance with the situation. More specifically, the clock synchronous circuit is stopped when no synchronous clock is necessary or in modes, such as a standby mode, bank active mode, refresh mode, and write mode, other than a read mode. In the read mode, the clock synchronous circuit is operated because a synchronous clock is necessary to output data. In the read mode, the number of clocks, i.e., CL, required from the time a read command is input to the time data is actually output, is 3 or more, when restarting and preamble of the clock synchronous circuit are taken into consideration.

55 Claims, 25 Drawing Sheets

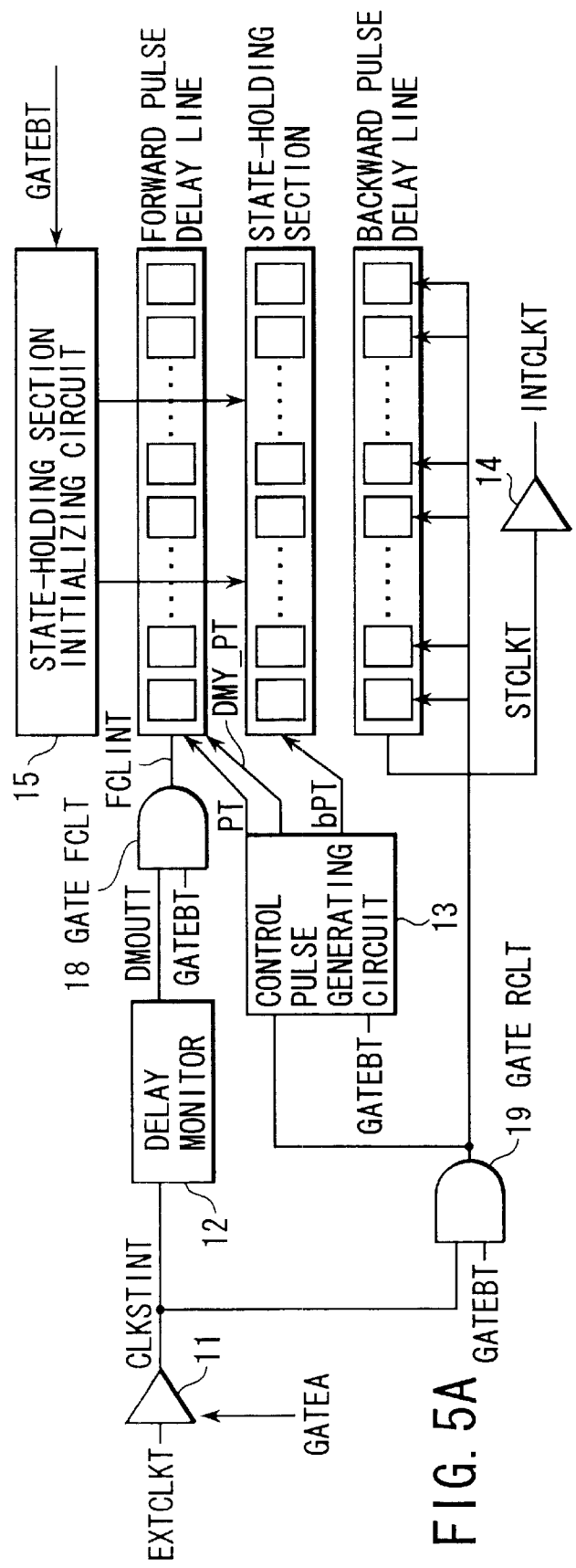
FIG. 5A
FIG. 5B
FIG. 5C

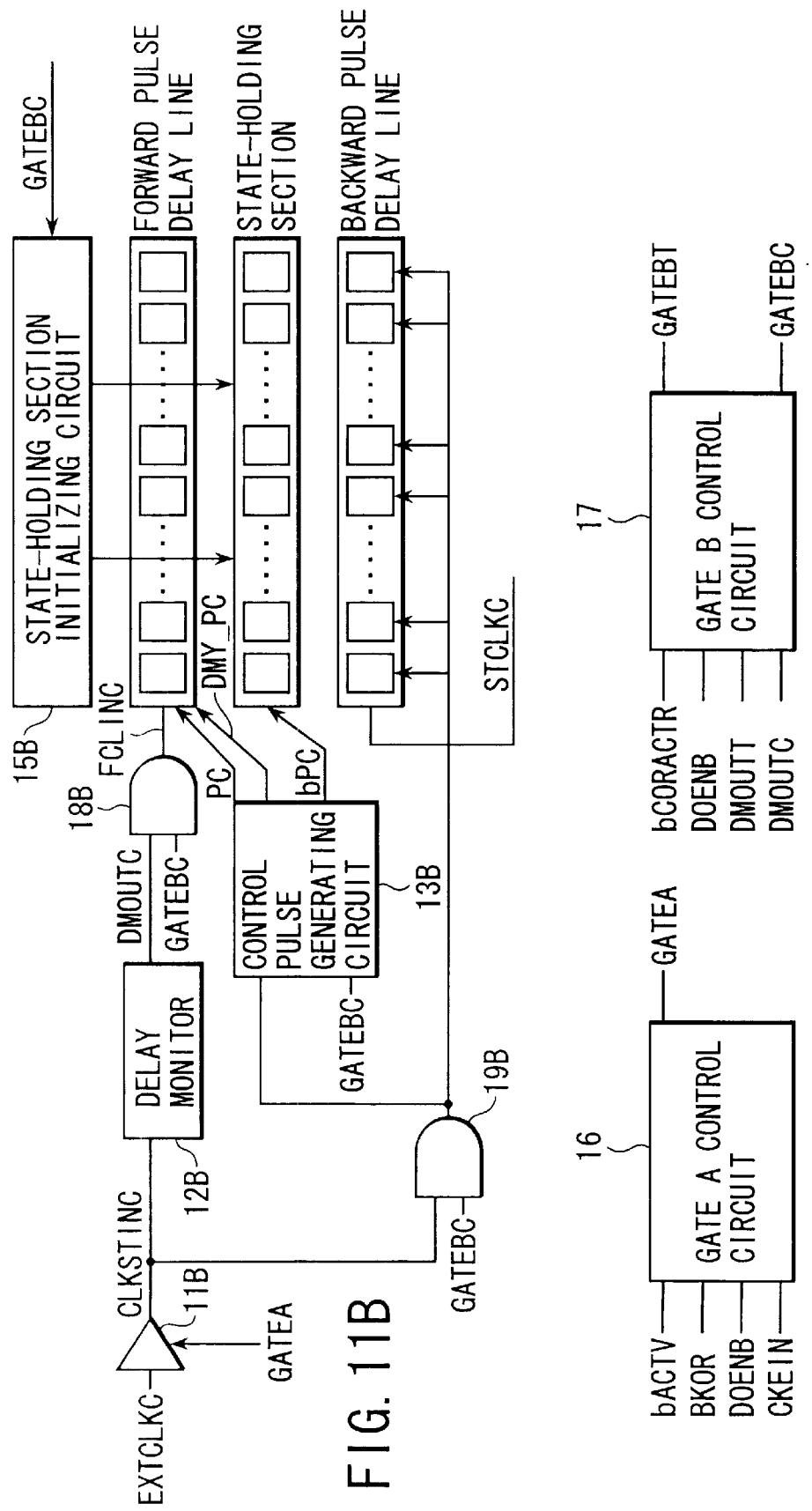

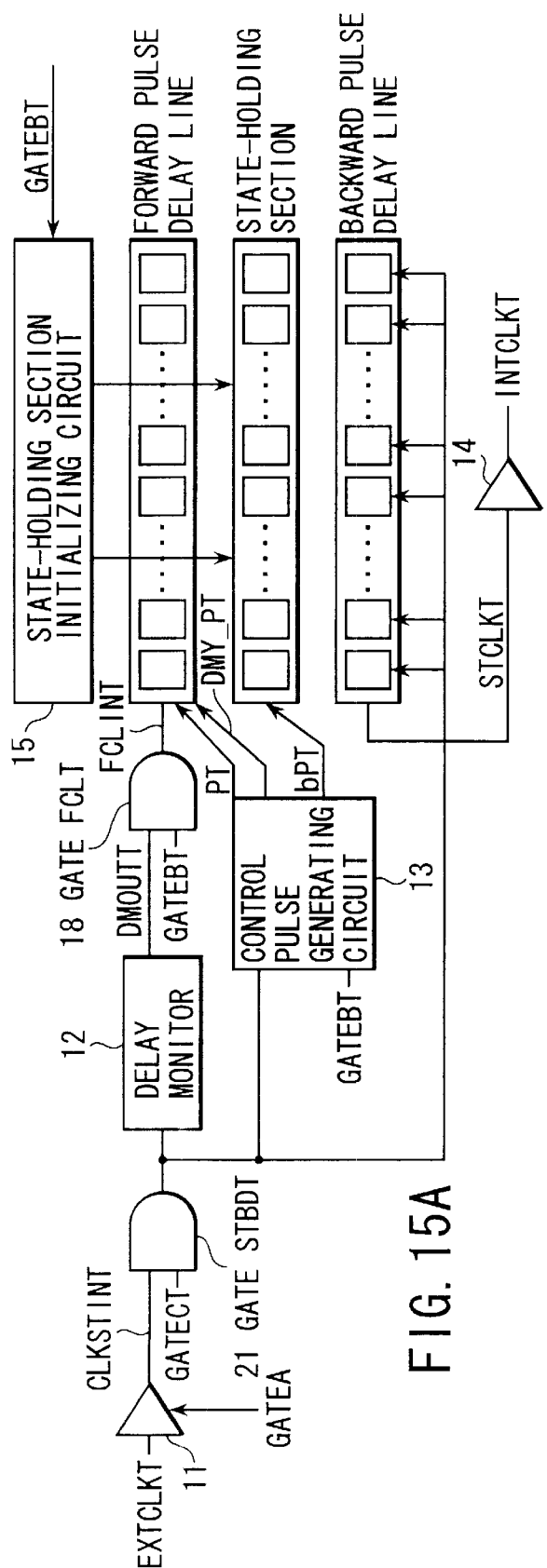
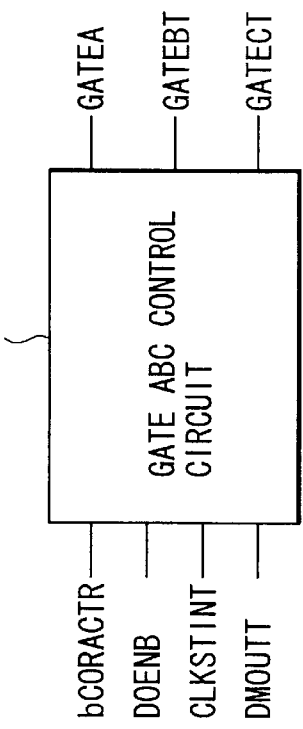
FIG. 15A
FIG. 15B

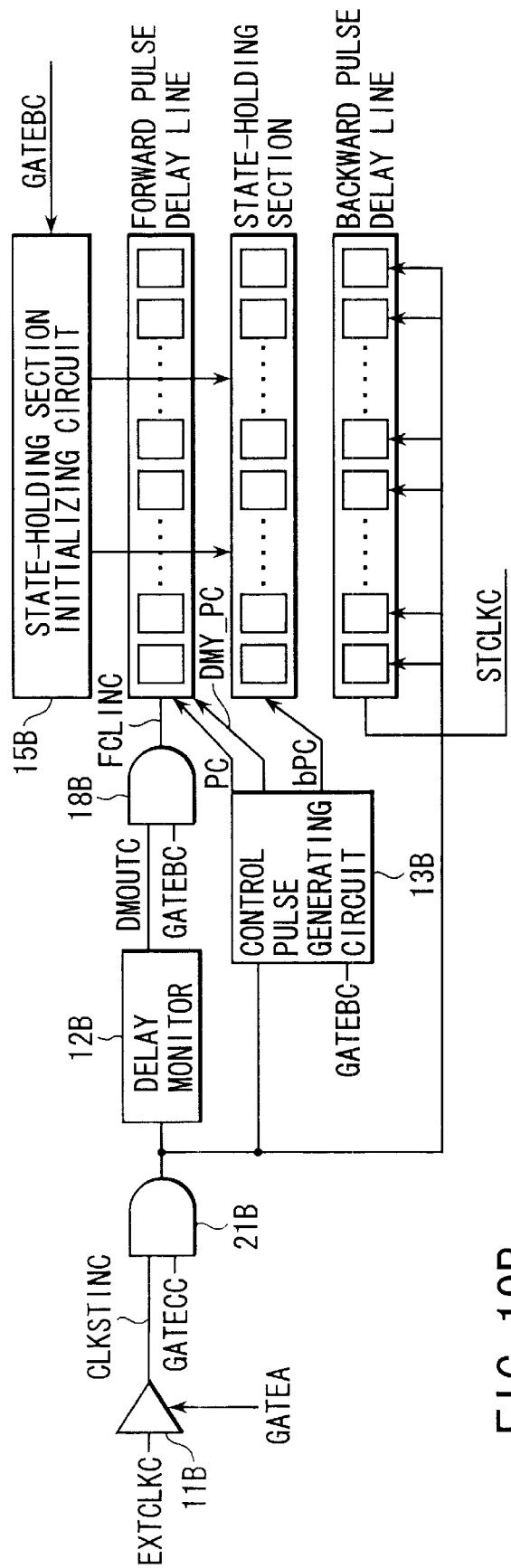
FIG. 19B
FIG. 19C

CLOCK SYNCHRONOUS CIRCUIT

CROSS-REFERENCE TO RELATED APPLICATIONS

This application is based upon and claims the benefit of priority from the prior Japanese Patent Application No. 2000-297449, filed Sep. 28, 2000, the entire contents of which are incorporated herein by reference.

BACKGROUND

The present invention relates to a clock synchronous circuit suitable for devices such as clock synchronous type memories, e.g., a double-data-rate DRAM (DDR DRAM), synchronous DRAM (SDRAM), and double-data-rate, fast-cycle RAM, which perform synchronous control by using high-speed clocks.

Recent computer systems sometimes use a clock synchronous type memory such as a synchronous DRAM to meet demands for high-speed processing. Such a clock synchronous type memory internally uses a clock synchronized with a clock (external clock) which controls the memory.

If even a slight synchronous error is produced between the clock (internal clock) used inside the memory and the external clock especially during high-speed operation, internal circuits of the memory readily generate operation errors. Also, data output from the memory by using an internal clock having a synchronous difference interferes with high-speed processing of a controller which uses the data.

Accordingly, recent memories have a clock synchronous circuit for synchronizing an internal clock with an external clock with high accuracy inside a chip.

A memory having this clock synchronous circuit can stably perform high-speed operations. However, compared to a memory having no such clock synchronous circuit, the current consumption of the entire chip increases by an electric current consumed by the clock synchronous circuit. To alleviate this handicap, when the internal clock generated by the clock synchronous circuit is not used by internal circuits of the memory, it is necessary to stop the operation of the clock synchronous circuit as much as possible and thereby reduce the current consumption of the entire chip.

SUMMARY

A clock synchronous circuit of an aspect of the present invention comprises a receiver for receiving an external clock, a delay monitor which receives an output signal from the receiver and has a delay time equal to the sum of the delay time of the receiver and the delay time of a circuit as an object of delay control, a first delay line which comprises a plurality of series-connected first delay units and delays an output signal from the delay monitor by a predetermined time, a second delay line which comprises a plurality of series-connected second delay units, and outputs a signal obtained by delaying the output signal from the delay monitor by the predetermined time and again delaying the output signal from the delay monitor by the predetermined time, and outputs the signal, an input interrupting circuit for determining start and stop of the first and second delay lines, and a control circuit for controlling the operation of the input interrupting circuit.

BRIEF DESCRIPTION OF THE DRAWINGS

FIGS. 5A, 5B, and 5C are block diagrams showing an STBD according to the first embodiment of the present invention;
FIGS. 11A, 11B, 11C, and 11D are block diagrams showing an STBD according to the second embodiment of the present invention;
FIGS. 15A and 15B are block diagrams showing an STBD according to the third embodiment of the present invention;
FIGS. 19A, 19B, and 19C are block diagrams showing an STBD according to the fourth embodiment of the present invention.

DETAILED DESCRIPTION

A clock synchronous circuit of the present invention will be described in detail below with reference to the accompanying drawings.

1. Reference Example

Figure 1:
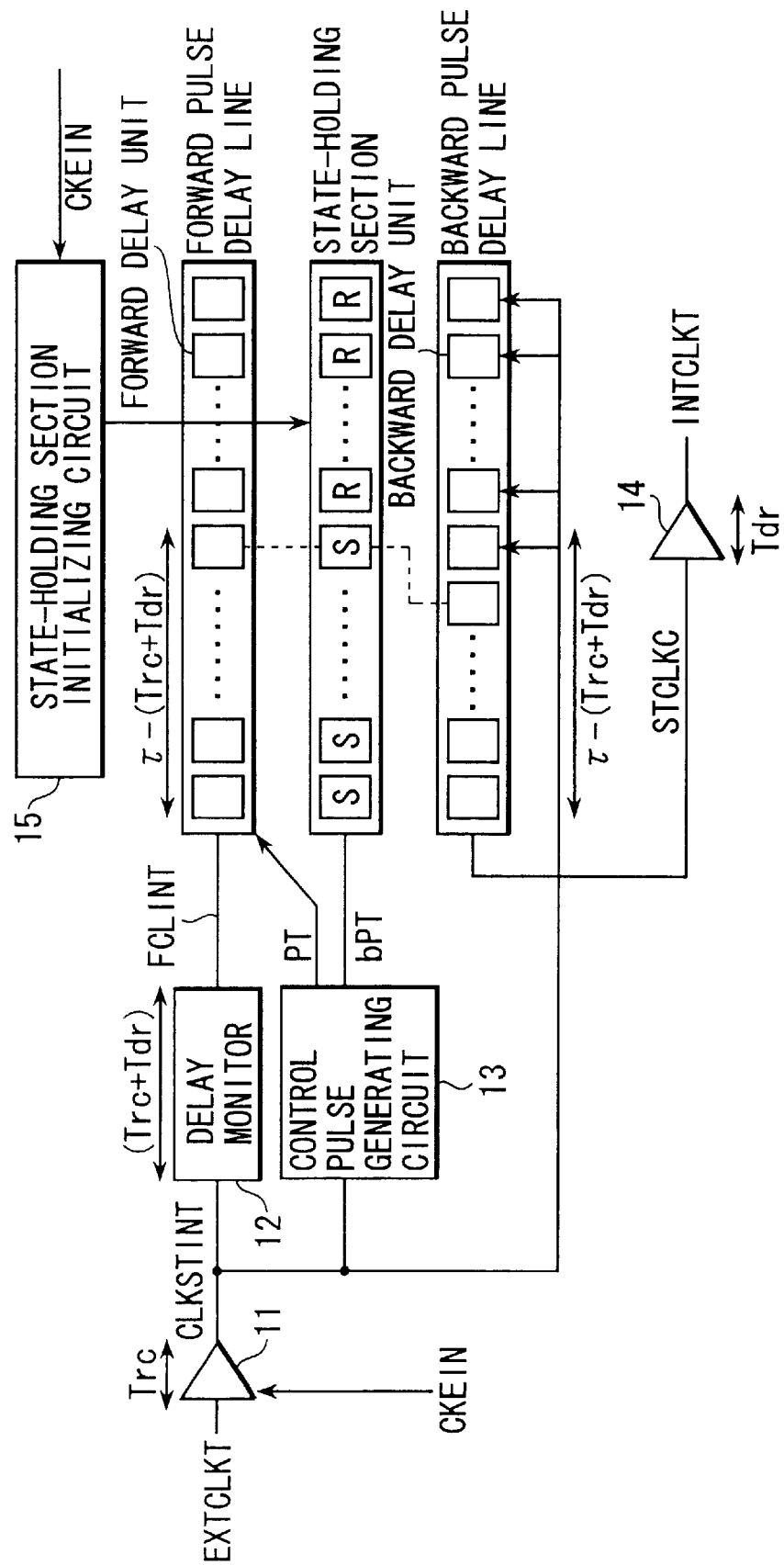
FIG. 1 is a block diagram showing a conventional STBD.

FIG. 1 shows a clock synchronous circuit as a reference example as the premise of the present invention.

In this example, an STBD (Synchronous Traced Backward Delay) type clock synchronous circuit will be explained.

First, the operation of this STBD will be briefly described below.

Assume, in this STBD, that the output node of the Nth forward delay unit is connected to the input node of the Nth state-holding section, the output node of which is connected to the input node of the (N−1)th backward delay unit.

Figure 2:
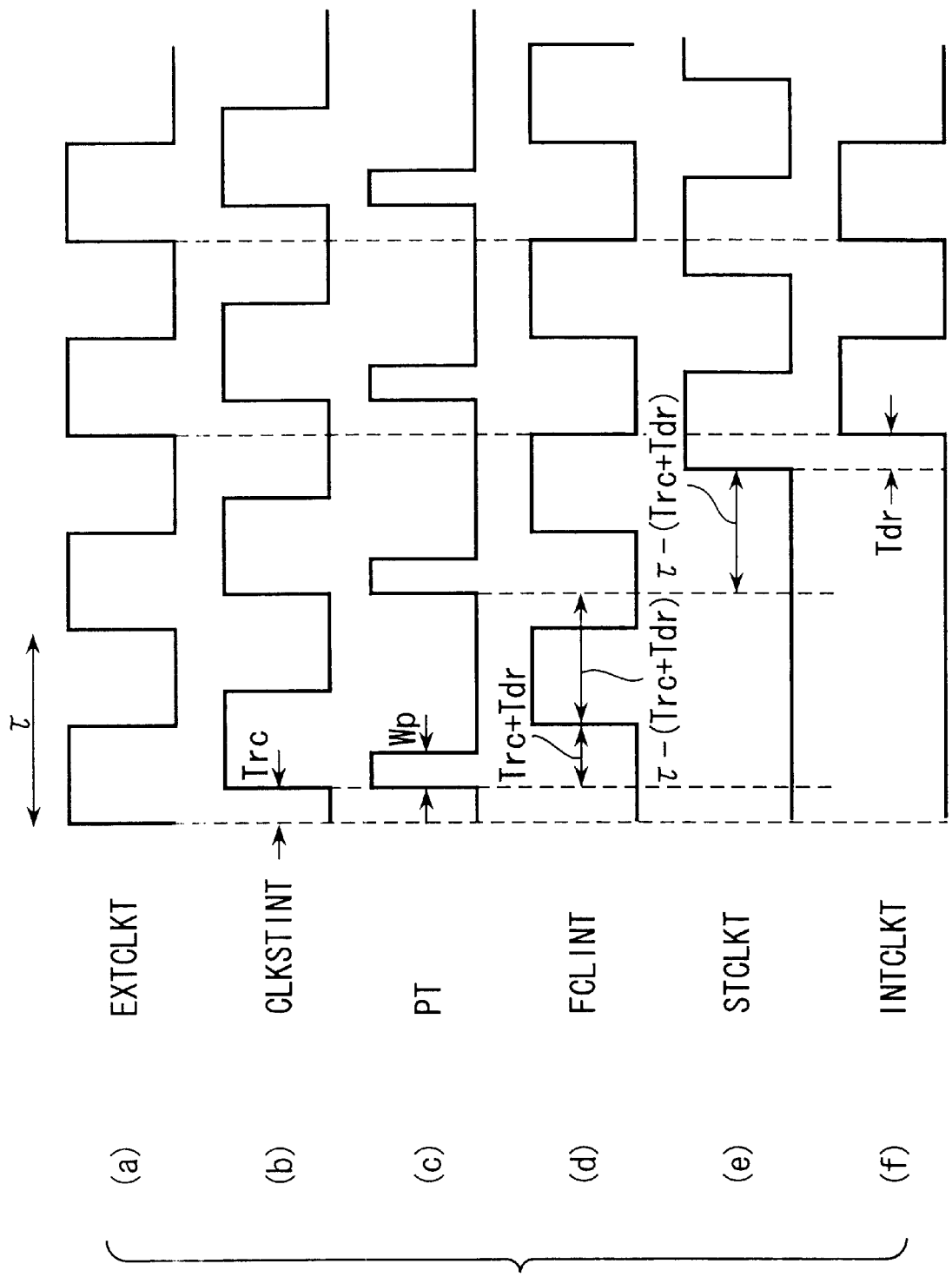
FIG. 2 is a timing chart showing the operation of the STBD shown in FIG. 1.

FIG. 2 is a timing chart for explaining the operation principle of the STBD.

Assume that an external clock EXTCLKT, indicated by (a) in FIG. 2, which has a period τ is input to a receiver 11.

The receiver 11 shapes the waveform of EXTCLKT, amplifies it, and outputs as CLKSTINT. Assuming the delay time of the receiver 11 is Trc, CLKSTINT lags behind EXTCLKT by Trc ((b) in FIG. 2). The output signal CLKSTINT from the receiver 11 is input to a delay monitor 12, a control pulse generating circuit 13, and a backward pulse delay line.

The control pulse generating circuit 13 changes CLKSTINT into a pulse to generate a control pulse signal PT having a pulse width Wp at the period τ which rises in synchronism with CLKSTINT ((c) in FIG. 2).

The delay monitor 12 has a delay time (Trc+Tdr) equal to the sum of the delay time Trc of the receiver 11 and a delay time Tdr of a driver 14. Accordingly, an output signal FCLINT from this delay monitor 12 is input to a forward pulse delay line with a delay (Trc+Tdr) from the output signal CLKSTINT from the receiver 11 ((d) in FIG. 2).

This forward pulse delay line is constructed by cascade-connecting forward delay units. Each forward delay unit propagates a forward pulse from the preceding stage to the succeeding stage when the control pulse signal PT is at low level (Low), and stops the propagation of the forward pulse when the control pulse signal PT is at high level (High).

FCLINT propagates on the forward pulse delay line only during a period $\{\tau-(Trc+Tdr)\}$ from the beginning of propagation to the time the control pulse signal PT goes High ((d) in FIG. 2). A state-holding section stores the propagation state of the forward pulse. On the basis of this information, a state-holding section controls the backward pulse delay line such that the propagation time of the backward pulse is equal to that of the forward pulse.

This state-holding section takes two states, i.e., a set state and a reset state, and outputs control signals corresponding to these states to a backward delay unit. A backward delay unit controlled by a state-holding section in the set state transfers the output from the succeeding backward delay unit directly to the preceding stage.

A backward delay unit controlled by a state-holding section held in the reset state transfers the output signal from the receiver 11 to the preceding backward delay unit. A state-holding section in the initial state is reset by a state-holding section initializing circuit 15. The state-hold section maintains the reset state if no forward pulse propagates, and changes to the set state if a forward pulse propagates.

When the control pulse signal PT goes High, CLKSTINT is also High ((b) and (c) in FIG. 2), so High is input to backward delay units (e.g., the Nth and subsequent units in FIG. 1) controlled by a state-holding section in the reset state. Assuming the number of stages through which a forward pulse propagates is N, the first to Nth state-holding sections are in the set state. Therefore, an input signal from the Nth backward delay unit controlled by the (N+1)th state-holding section in the reset state is transmitted as a backward pulse to the preceding backward delay unit.

Consequently, the number of backward delay units through which a backward pulse propagates is equal to the number of forward delay units through which a forward pulse propagates. When these two types of delay units are so designed as to have the same delay time, the input CLKSTINT to the backward pulse delay line propagates on the delay line for the same period $\{\tau-(Trc+Tdr)\}$ as the period during which a forward pulse propagates on the delay line, and is output ((e) in FIG. 2).

This output is then input to the driver 14 and delayed by the delay time Tdr of the driver 14 to form INTCLKT ((f) in FIG. 2).

When the delay time from the time the external clock EXTCLKT is input to the time the internal clock INTCLKT is generated is defined as Δtotal, it is $$\Delta total = \Delta msr + \Delta prp \quad (1)$$

where Δmsr is the time necessary to measure the number of stages through which a forward pulse propagates, and Δprp is the time necessary to output the internal clock INTCLKT on the basis of the number of propagation stages of the forward pulse.

Also, since Trc, (Trc+Tdr), $\{\tau-(Trc+Tdr)\}$, $\{\tau-(Trc+Tdr)\}$, and Tdr are required to pass through the receiver 11, pass through the delay monitor 12, propagate on the forward pulse delay line, propagate on the backward pulse delay line, and pass through the driver 14, respectively, Δmsr and Δprp are given by $$\Delta msr = (Trc+Tdr) + \{\tau-(Trc+Tdr)\} = \tau \quad (2)$$

$$\Delta prp = Trc + \{\tau-(Trc+Tdr)\} + Tdr = \tau \quad (3)$$

From above equation (3), Δprp=τ.

As a consequence, INTCLKT synchronizes with EXTCLKT. From above equations (1) to (3), a time required to synchronize the external clock with the internal clock is 2τ.

A memory or the like incorporating the above STBD has a power down mode which can reduce the current consumption by halting external input signals such as the external clock EXTCLKT by the receiver 11 and stopping internal circuits of the memory.

One external input signal for controlling this power down mode is CKE. If CKE goes "Low", the memory enters the power down mode (power down entry); if CKE goes "High", the memory leaves the power down mode (power down exit).

Stop and restarting of the receiver 11 in the input section of the STBD are controlled by a signal CKEIN obtained by receiving the external input signal CLK by the receiver. Note that stop and start of the STBD can be controlled by CKEIN↓ (power down entry) and CKEIN↑ (power down exit). However, this control cannot be performed in modes other than the power down entry and power down exit.

When the STBD is used as a clock synchronous circuit, an internal clock (synchronous clock) can be generated within a short time period of 2τ even if the operation of this STBD is stopped. Hence, it is possible to control stop and start of the operation of the STBD and reduce the power consumption in accordance with the situation.

Noticing this fact, the present inventors have found that the STBD (clock synchronous circuit) can be stopped in a standby state during an operation in which CL (CAS Latency)=2 and proposed a control method and control circuit for the purpose. CL is the number of clocks after a read mode is detected and before data is actually output.

The proposition will be briefly described below.

In a semiconductor memory, independently controllable memory cell arrays and their control circuits are called banks. Selecting a bank to perform data read, write, and refresh is called bank active. A mode in which no bank is activated is called standby.

Figure 3:
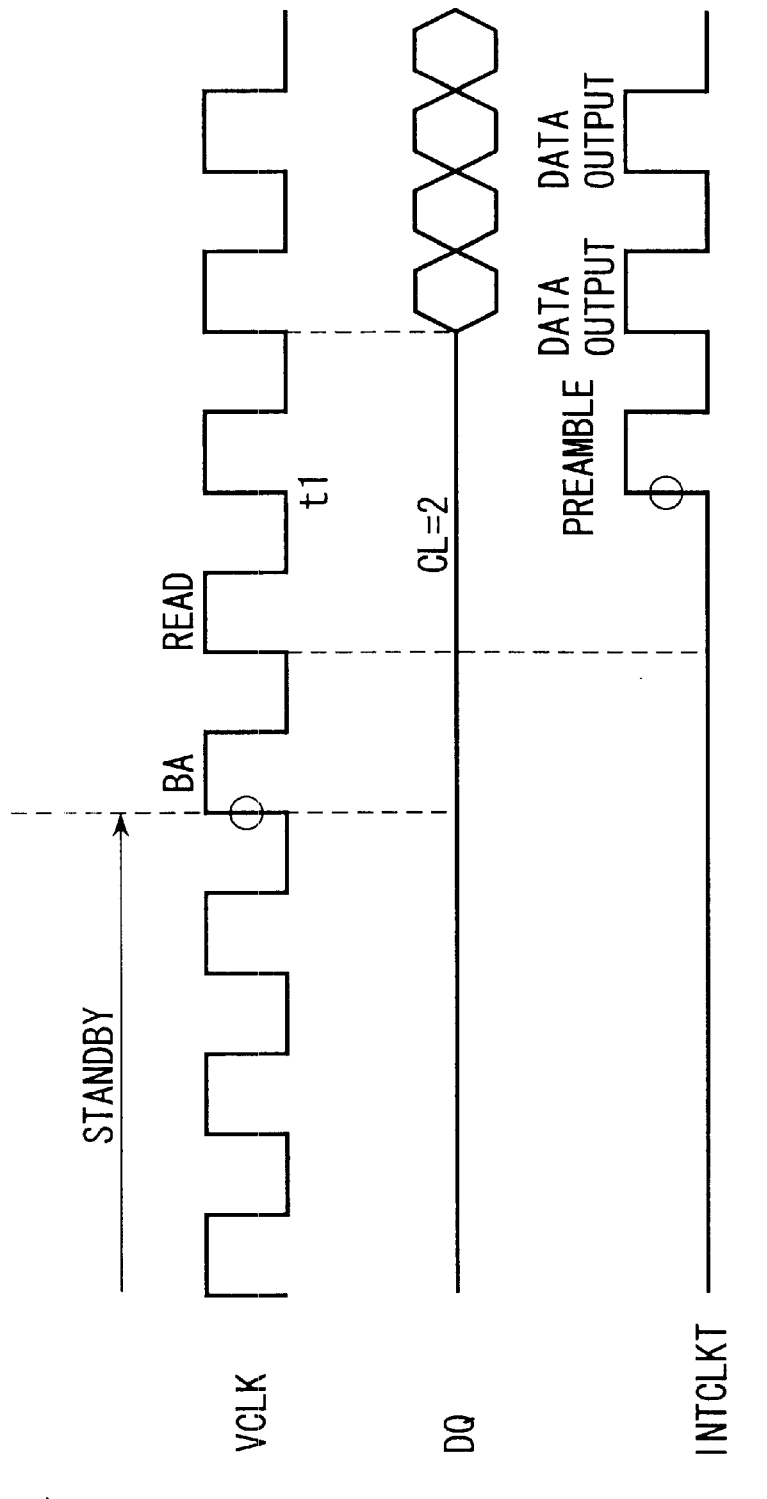
FIG. 3 is a timing chart showing timings from standby to restarting of the STBD shown in FIG. 1.

FIG. 3 shows a proposition in standby.

In standby, the STBD is at rest. When CL=2, an internal clock INTCLKT must be synchronously output at timing t1 if a READ command is received one clock after the reception of a Bank Active (BA) command, by taking account of a case in which the external clock has a low frequency.

For this purpose, the STBD must load EXTCLKT as an object of the Bank Active command into the memory.

When CL=2, therefore, the operation of the STBD is started on the basis only of the Bank Active command, regardless of the presence/absence of the READ command. That is, after the Bank Active (BA) command is input, the STBD is started even if the READ command is not received (even if a command other than the READ command is received). Consequently, an electric current is wasted in the STBD.

In this system according to the above proposition, CL=2 is assumed. In the state of Bank Active, therefore, the STBD operates regardless of the presence/absence of the READ command.

Figure 4:
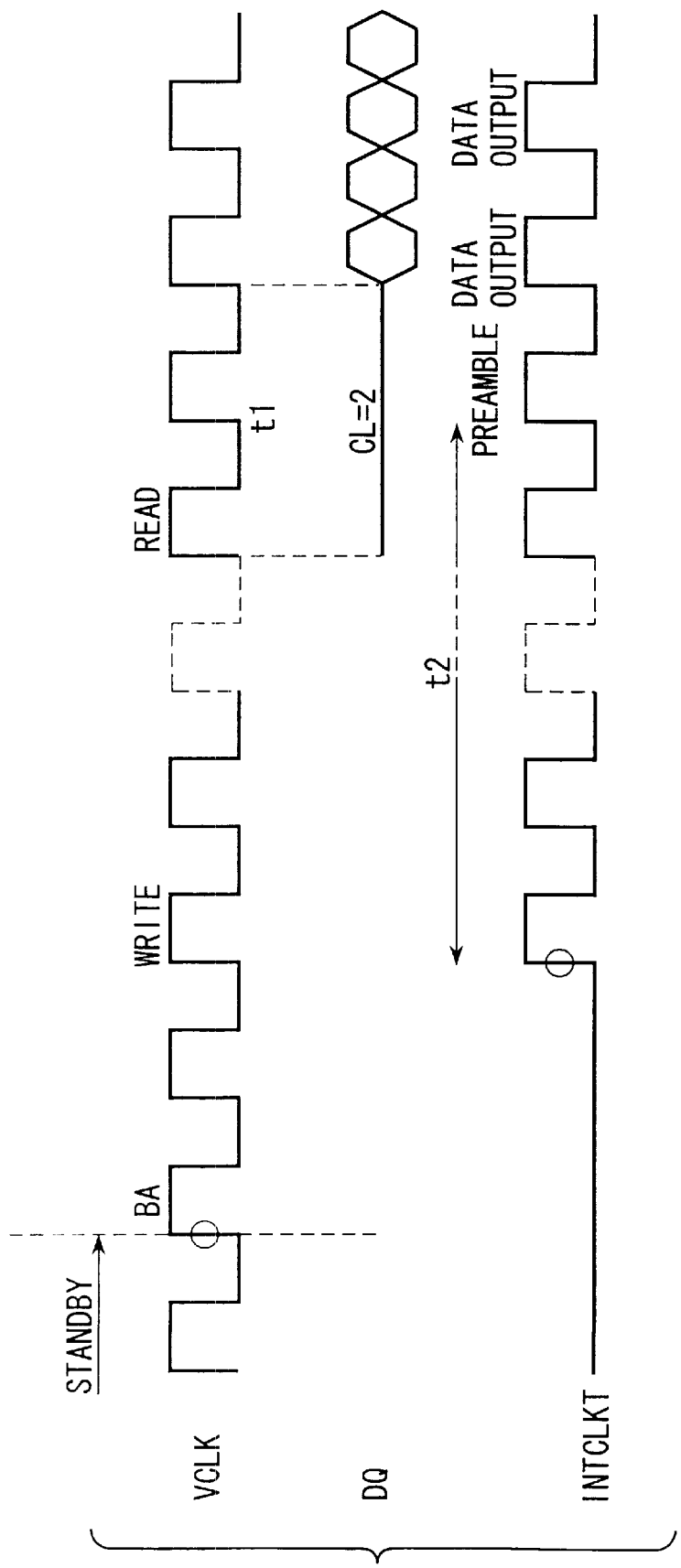
FIG. 4 is a timing chart showing a problem arising from standby to restarting of the STBD shown in FIG. 1.

FIG. 4 shows operating waveforms when the Bank Active command is input after the standby state, and subsequently a Write command is input. In the system according to the above conventional proposition, the STBD is restarted on the basis only of the Bank Active command. Hence, the STBD operates during a period t2 in which the internal clock INTCLKT is unnecessary, thereby wasting an electric current.

A memory having a clock synchronous circuit can stably perform high-speed operations. However, compared to a memory having no such clock synchronous circuit, the current consumption of the entire chip increases by an electric current consumed by the clock synchronous circuit. To alleviate this handicap, when the internal clock generated by the clock synchronous circuit is not required by internal circuits of the memory, it is necessary to stop the operation of the clock synchronous circuit as much as possible and thereby reduce the current consumption of the entire chip.

Unfortunately, no clock synchronous circuit stop control system has been well established, and no practical mode except for power down has been proposed. Even in the invention proposed by the present inventors, CL=2 of a DDR SDRAM is assumed, so the STBD is restarted on the basis only of the Bank Active command.

Consequently, the STBD operates in a mode such as a write mode, other than a read mode, not requiring the synchronous clock INTCLKT. This increases the current consumption of the whole chip.

2. First Embodiment

FIGS. 5A, 5B, and 5C are block diagrams showing an STBD according to the first embodiment of the present invention.

The STBD according to this embodiment differs from the STBD (FIG. 1) as a reference example in that two input interrupting gates (a gate FCLT 18 and a gate RCLT 19) for stop control are included, and two control circuits (a gate A control circuit 16 and a gate B control circuit 17) for controlling these gates are added.

Figure 6:
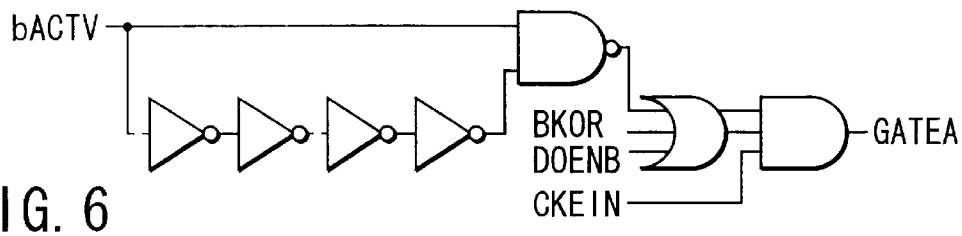
FIG. 6 is a circuit diagram showing a practical example of a gate A control circuit.
Figure 7:
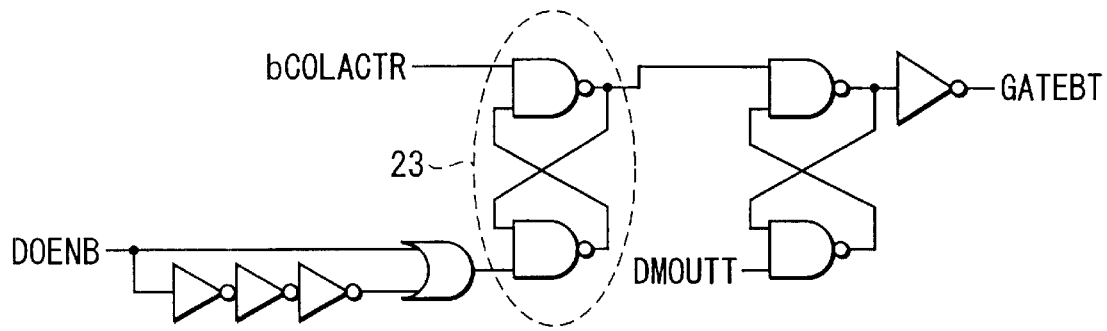
FIG. 7 is a circuit diagram showing a practical example of a gate B control circuit.
Figure 8:
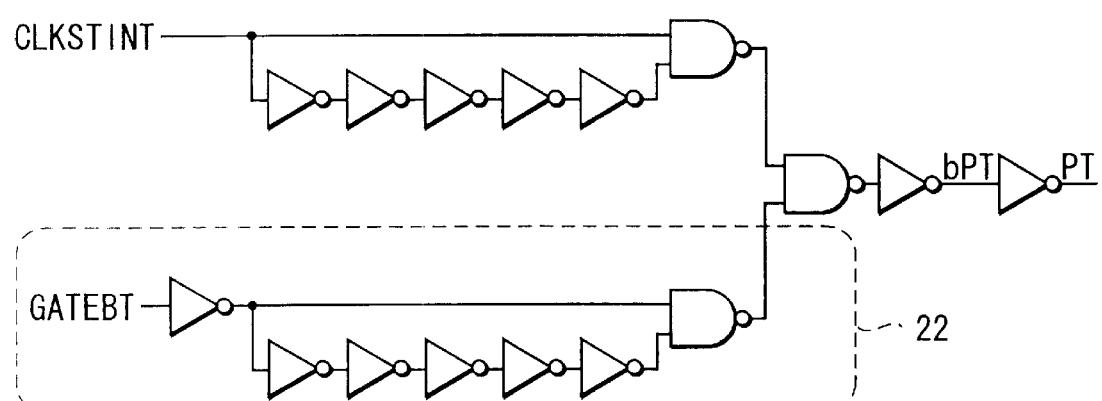
FIG. 8 is a circuit diagram showing a practical example of a control pulse generating circuit.

FIG. 6 shows a practical example of the gate A control circuit 16. FIG. 7 shows a practical example of the gate B control circuit 17. FIG. 8 shows a practical example of a control pulse generating circuit 13.

A series of operations of start and stop of this STBD when a Bank Active command is input from Standby, and subsequently a READ command is input will be described below by using a timing chart in FIG. 9.

Signals for determining start and stop of the STBD are CKEIN, DOENB, BKOR, bACTV, and bCOLACTR.

CKEIN is a power down signal of the memory. CKEIN is at low level (Low) during power down and at high level (High) in other cases. DOENB is a signal indicating whether read data is being output. DOENB is "High" while read data is being output and "Low" when the read data output is completed. BKOR is a signal indicating whether the bank is in an active state. BKOR is "High" when the bank is in the active state and "Low" when the bank is in a standby state (Standby). bACTV is a signal which assists BKOR.

A delay time from the time the bank becomes active to the time BKOR goes "High" is very long owing to the circuit configuration of the memory. bACTV detects a Bank Active (BA) command and outputs a "Low" pulse before BKOR goes "High". When receiving a READ command inside the memory, bCOLACTR outputs a "Low" pulse.

When the bank is in the standby state (Standby), CKEIN is "High", bACTV is "High", BKOR is "Low", and DOENB is "Low". Therefore, an output signal GATEA from the gate A control circuit goes "Low". Since a receiver 11 which receives this output signal GATEA is in a stopped state, the STBD is completely stopped in the standby state.

A Bank Active command is input from this state.

bACTV outputs a "Low" pulse, and BKOR goes "High" with a slight delay. As a consequence, GATEA also goes "High". Since GATEA is "High", the receiver 11 starts operating to supply an external clock EXTCLKT to the internal circuits of the STBD as CLKSTINT.

At this point, however, no READ command is input, so GATEBT is still "Low". Consequently, both the gate FCLT 18 and the gate RCLT 19 stay closed. That is, when the Bank Active command is input, only the receiver 11 and a delay monitor 12 operate, and the other circuits stay stopped by GATEBT↓. Accordingly, no internal clock INTCLKT is generated.

After that, a READ command is input.

When this READ command is received, bCOLACTR outputs a "Low" pulse inside the memory. The gate B control circuit 17 receives this pulse and, in order to input only a "High" edge which has fulfilled the period to a forward pulse delay line, confirms that an input signal DMOUTT to the gate FCLT 18 is "Low". After that, the gate B control circuit 17 changes GATEBT to "High".

Upon receiving GATEBT↑ (the leading edge of GATEBT), a state-holding section initializing circuit 15 releases the initialization of a state-holding section and prepares for a set operation. The gate RCLT 19 becomes operative upon receiving GATEBT↑ and starts supplying a clock to a backward pulse delay line.

Figure 9:
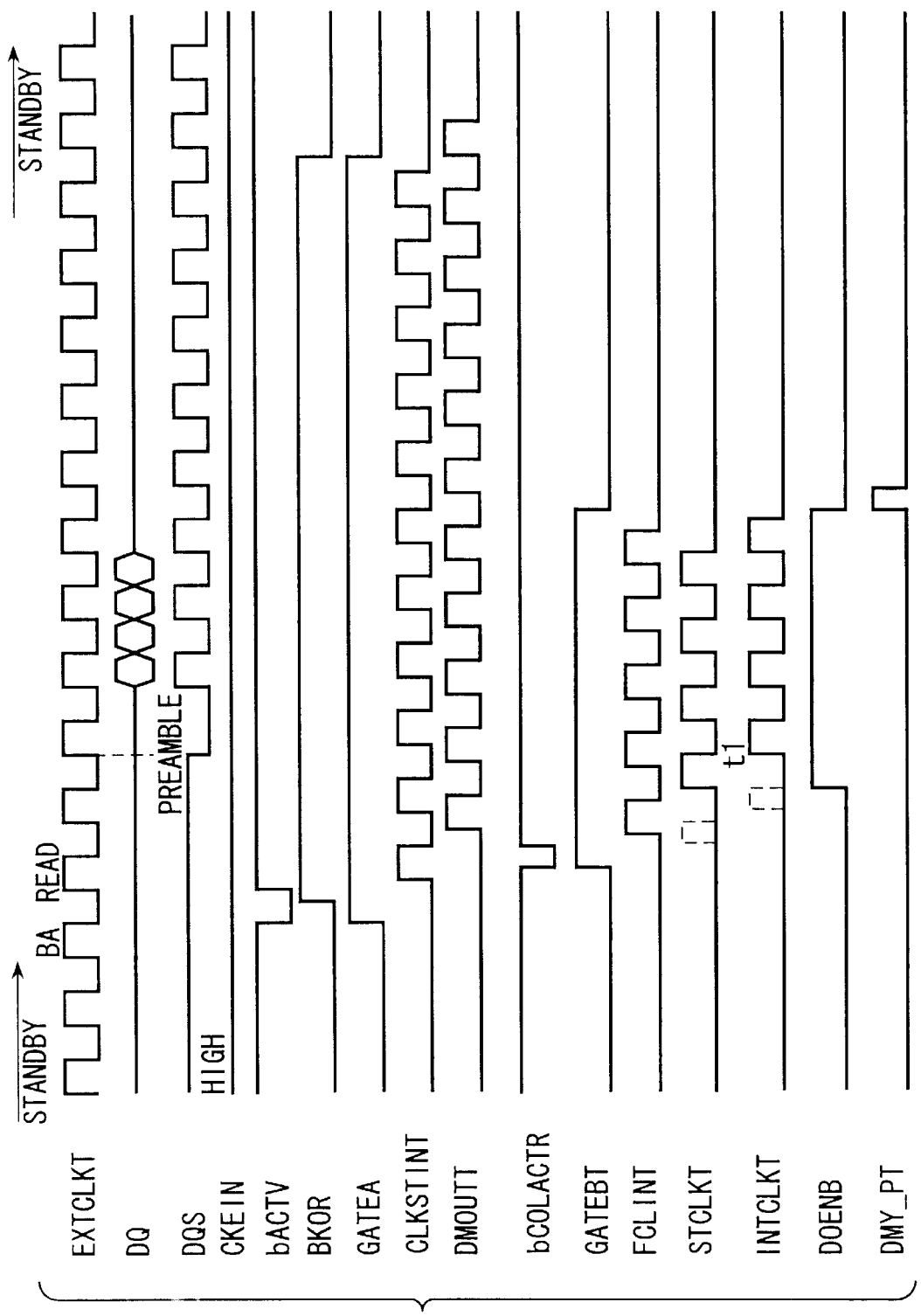
FIG. 9 is a timing chart showing start and stop of the STBD shown in FIG. 1.

Consequently, the internal clock INTCLKT synchronizing with EXTCLKT is output at t1 (FIG. 9).

After that, the output of data is completed, and only Bank Active remains. When the data output is complete, DOENB changes from "High" to "Low". The gate B control circuit 17 receives this change, releases the latching of a flip-flop ("23" in FIG. 7), and changes GATEBT to "Low". As a result, the gate FCLT 18 and the gate RCLT 19 stop operating.

That is, only the receiver 11 and the delay monitor 12 again become operative, and the other circuits are stopped by GATEBT↓ (the trailing edge of GATEBT).

Also, to erase a forward pulse propagating in a path 22 in the control pulse generating circuit shown in FIG. 8, GATEBT↓ outputs a pulse signal DMY_PT similar to a PT signal only once. In addition, to prepare for an operation after restarting, the state-holding section initializing circuit 15 resets all stages of the state-holding section.

After that, the standby state (Standby) begins. BKOR goes "Low", and GATEA also goes "Low" in response to that. Since this makes the receiver 11 completely unable to accept EXTCLKT, the STBD completely stops.

The effect of the STBD according to the first embodiment of the present invention will be explained with reference to FIG. 10.

Figure 10:
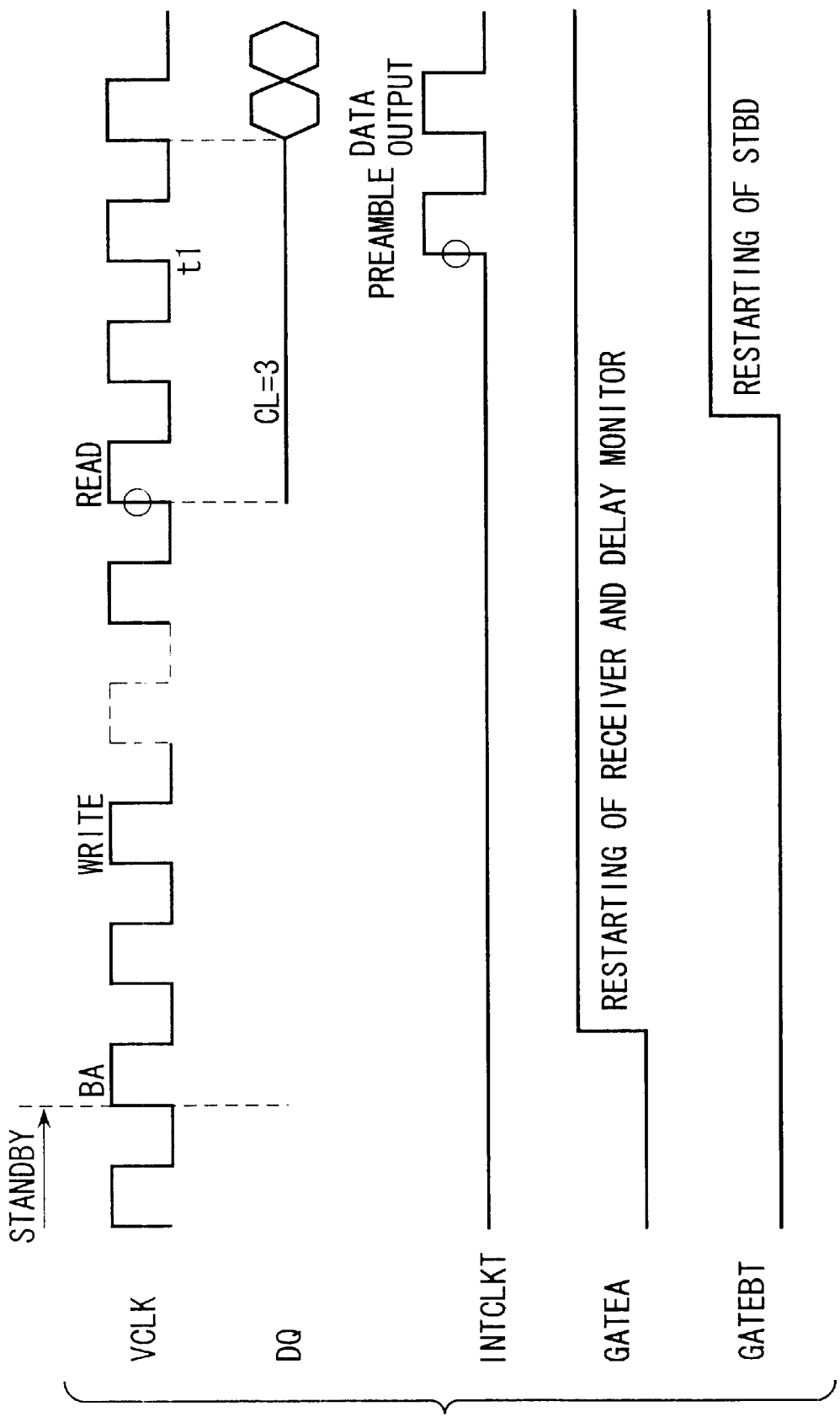
FIG. 10 is a timing chart showing the effect of the STBD shown in FIGS. 5A, 5B, and 5C.
Figure 11A:
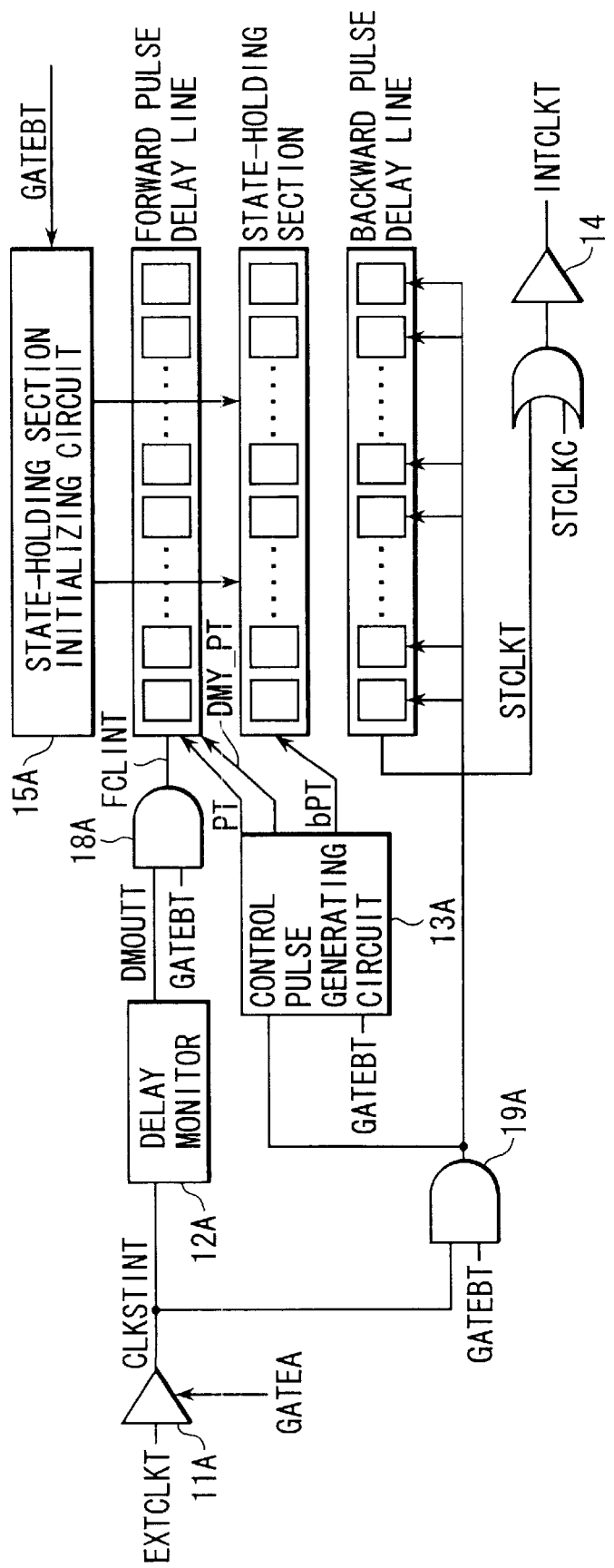

FIG. 10 shows the main portions of operating waveforms of the STBD shown in FIGS. 5A, 5B, and 5C.

This proposal is applicable when CL=3 or more in a DDR SDRAM.

In Standby, the STBD is completely stopped. Upon receiving a Bank Active command, GATEA goes "High", and the receiver 11 and the delay monitor 12 start operating. At this point, however, the gate FCLT 18 and the gate RCLT are stopped. Hence, the STBD is inoperative, so no internal clock INTCLKT is generated.

Accordingly, even when a command such as a Write command other than a READ command is input after that, the STBD does not start operating, so no electric current is wasted unlike in the conventional proposal.

In the STBD according to this first embodiment, when a READ command is input, bCOLACTR is output, and the gate FCLT 18 and the gate RCLT 19 become operative. That is, the STBD starts operating in response to the input of a READ command. Therefore, a synchronous clock is output at preamble t1.

After data is output, the STBD again stops, and only the receiver 11 and the delay monitor 12 are operative in the Bank Active state. That is, the STBD consumes an operating current only when data is output by a READ command. This can greatly reduce the current consumption of the whole chip.

3. Second Embodiment

FIGS. 11A, 11B, 11C, and 11D are block diagrams showing an STBD according to the second embodiment of the present invention.

Figure 12:
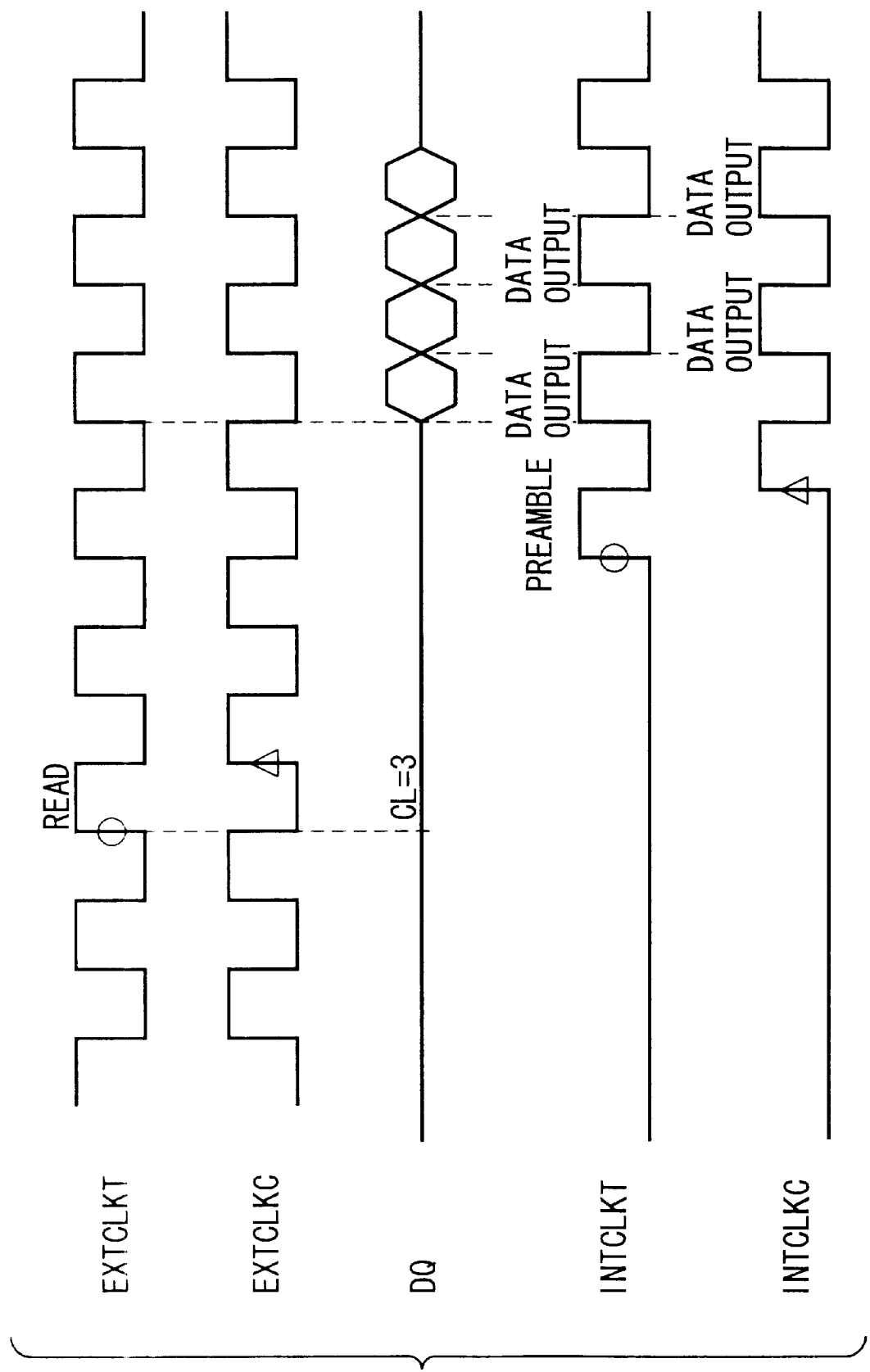
FIG. 12 is a timing chart showing the relationship between two clocks used in a DDR SDRAM.

As shown in a timing chart of FIG. 12, a double-data-rate SDRAM outputs read data in synchronism with both the leading and trailing edges of an external clock EXTCLKT. Accordingly, a clock synchronous circuit must be configured by an STBD for generating an internal clock synchronized with the leading edge of EXTCLKT and an STBD for generating an internal clock synchronized with the trailing edge of EXTCLKT.

In a memory such as a double-data-rate SDRAM, an internal clock is sometimes generated on the basis only of an external clock EXTCLKT in synchronism with both the leading and trailing edges of EXTCLKT. In some cases, however, an external clock EXTCLKT and an external clock EXTCLKC whose phase is shifted a half cycle from that of EXTCLKT are given to the memory, and two internal clocks are generated on the basis of these external clocks EXTCLKT and EXTCLKC.

That is, the leading edge of an internal clock INTCLKT is generated on the basis of the leading edge of the external clock EXTCLKT. The trailing edge of the internal clock INTCLKT is generated on the basis of the leading edge of the external clock EXTCLKC. When a control system like this is used, EXTCLKT-STBD and EXTCLKC-STBD are necessary in a double-date-rate SDRAM.

Figure 13:
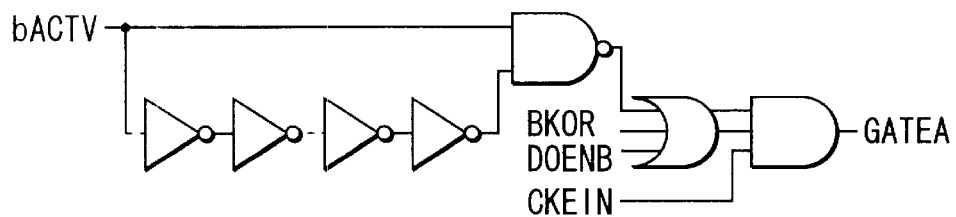
FIG. 13 is a circuit diagram showing a practical example of a gate A control circuit.
Figure 14:
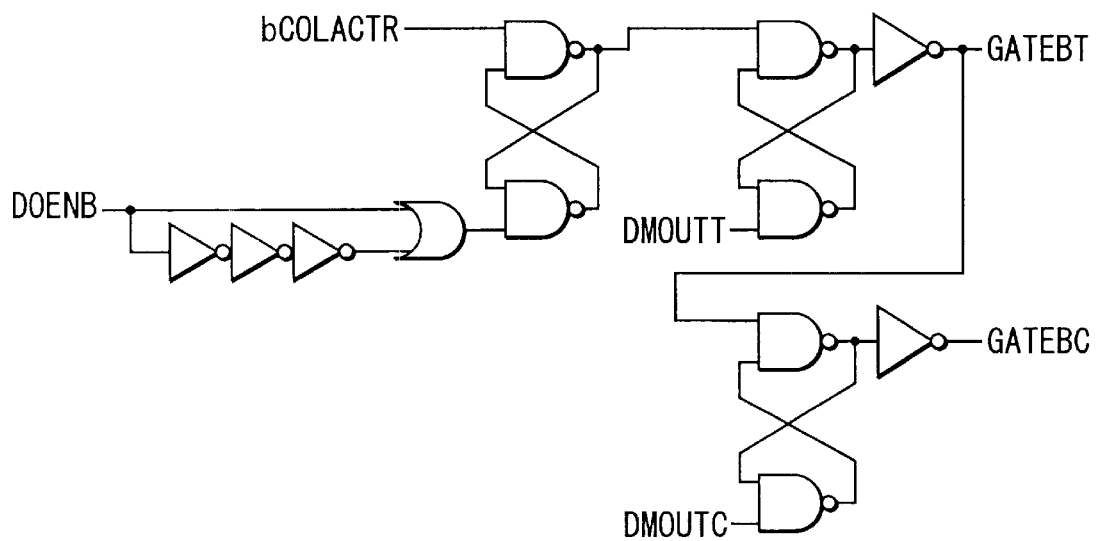
FIG. 14 is a circuit diagram showing a practical example of a gate B control circuit.

FIG. 13 shows a practical example of a gate A control circuit 16 shown in FIGS. 11A, 11B, 11C, and 11D. FIG. 14 shows a practical example of a gate B control circuit 17 shown in FIGS. 11A, 11B, 11C, and 11D.

In the following description, a T-STBD means an STBD for the external clock EXTCLKT, and a C-STBD means an STBD for the external clock EXTCLKC.

A stop control system for the T-STBD is exactly the same as the system described in the above first embodiment.

A stop control system for the C-STBD will be explained below.

All commands for controlling stop and restarting of the T-STBD are input in synchronism with the "High" edge of EXTCLKT. Therefore, if a period τ changes, the delay relationship between the command and the "High" edge of EXTCLKC changes accordingly. To eliminate this dependence on the period τ, a restarting signal for the C-STBD is delayed a half cycle from GATEBT for the T-STBD.

The internal operation of the C-STBD is exactly the same as that of the T-STBD.

4. Third Embodiment

FIGS. 15A and 15B are block diagrams showing an STBD according to the third embodiment of the present invention.

The STBD according to this embodiment differs from the STBD (FIG. 1) as a reference example in that two input interrupting gates (a gate STBDT 21 and a gate FCLT 18) for stop control are included, and a control circuit (a gate ABC control circuit 20) for controlling these gates is added.

Figure 16:
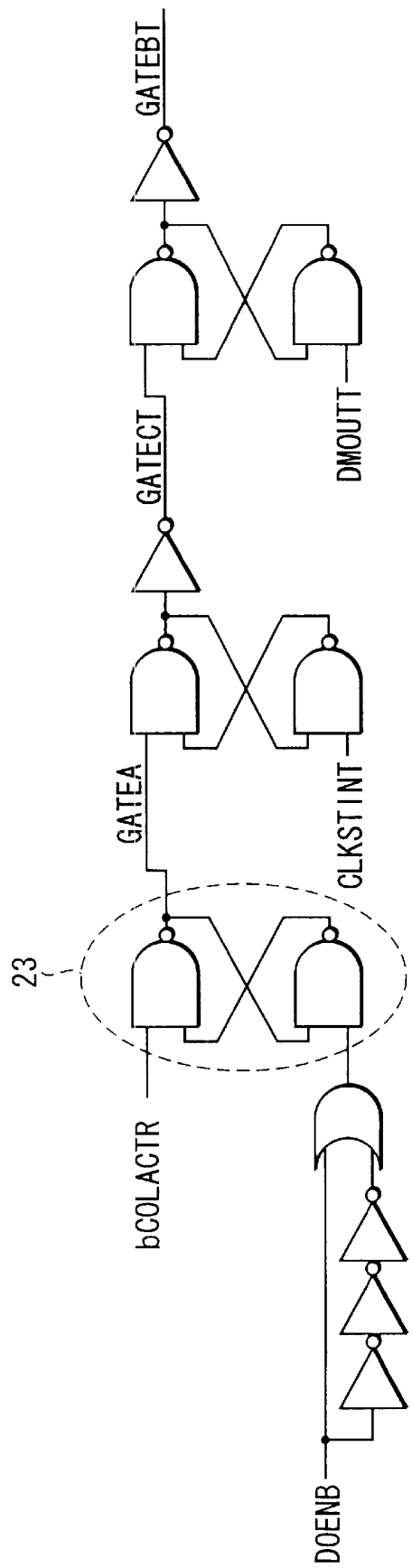
FIG. 16 is a circuit diagram showing a practical example of a gate ABC control circuit.

FIG. 16 shows a practical example of the gate ABC control circuit 20 shown in FIGS. 15A and 15B.

A series of operations of start and stop of this STBD when a Bank Active (BA) command is input after a standby state (Standby) and subsequently a READ command is input will be described below by using a timing chart in FIG. 17.

In this embodiment, signals for determining start and stop of the STBD are DOENB and bCOLACTR.

In the standby state (Standby) and Bank Active state, bCOLACTR is "High", and DOENB is "Low". Therefore, an output signal GATEA from the gate ABC control circuit 20 goes "Low". Since a receiver 11 which receives this output signal GATEA is inoperative (stopped), the STBD is completely stopped.

After that, a READ command is input.

When this READ command is received, bCOLACTR outputs a "Low" pulse inside the memory. The gate ABC control circuit 20 receives this pulse and changes GATEA to "High". By GATEA↑ (the leading edge of GATEA), the receiver 11 starts operating to supply an external clock EXTCLKT to the internal circuits of the STBD as CLKSTINT.

In order to input only a "High" edge which has fulfilled the period to the internal circuits of the STBD, however, the gate ABC control circuit 20 confirms that CLKSTINT at the input node of the gate STBDT is "Low", and then changes GATECT to "High".

Since the gate STBDT 21 becomes operative upon receiving GATECT↑, CLKSTINT is supplied as CLKSTINTD to the internal circuits of the STBD. In addition, to input only a "High" edge which has fulfilled the period to a forward pulse delay line, the gate FCLT 18 is operated after it is detected that DMOUTT at the input node of this gate FCLT 18 is "Low".

Upon receiving GATEBT↑, a state-holding section initializing circuit 15 releases the initialization of a state-holding section and prepares for a set operation.

Figure 17:
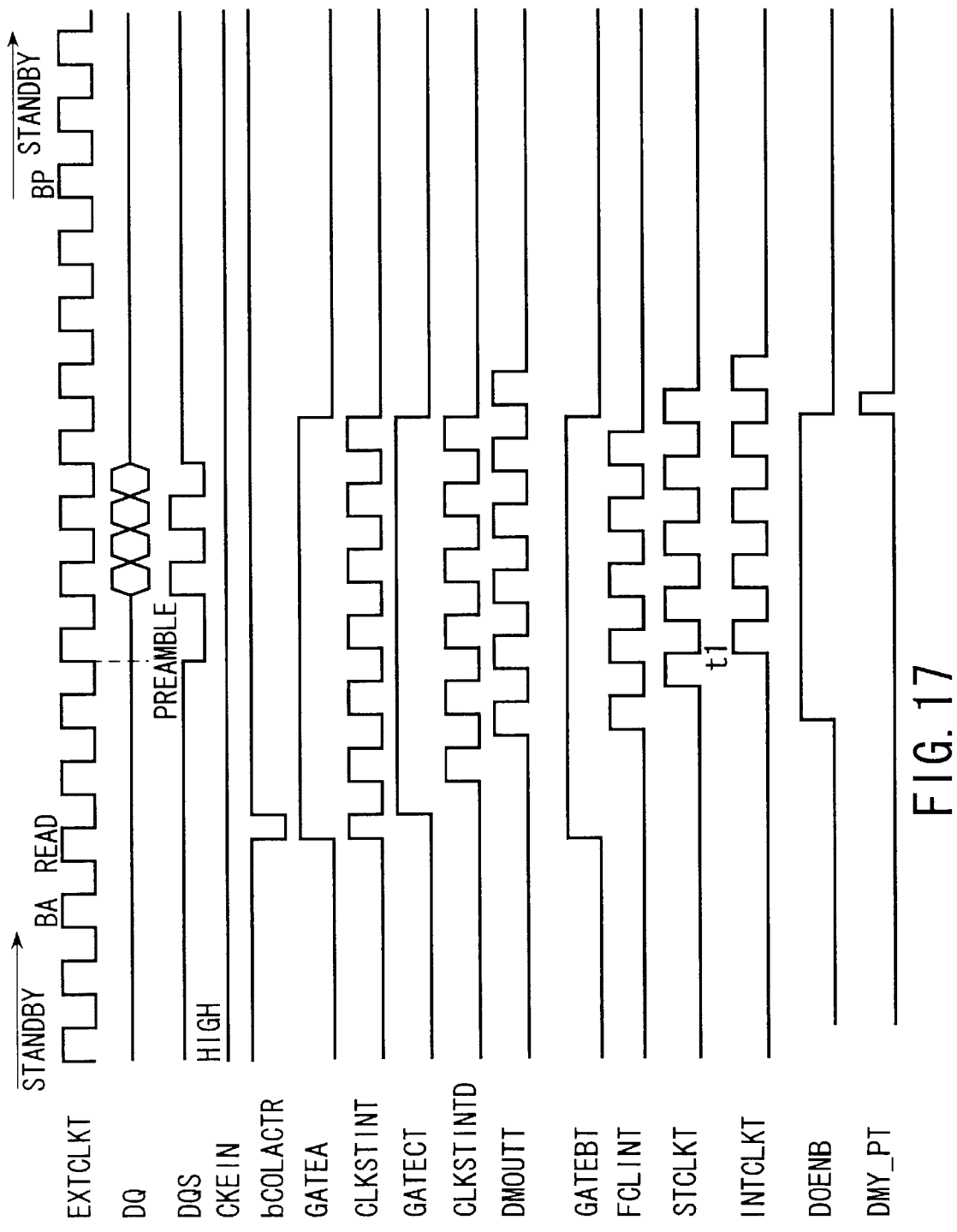
FIG. 17 is a timing chart showing start and stop of the STBD shown in FIGS. 15A and 15B.

Consequently, the internal clock INTCLKT synchronizing with EXTCLKT is output at t1 (FIG. 17).

After that, the output of data is completed, and only Bank Active remains. When the data output is complete, DOENB changes from "High" to "Low". The gate ABC control circuit 20 receives this change, releases the latching of a flip-flop ("23" in FIG. 16), and changes GATEAT, GATEBT, and GATECT to "Low". As a result, all gates close, and the receiver 11 also stops.

That is, the STBD completely stops. Also, to erase a forward pulse propagating in a control pulse generating circuit 13, GATEBT↓ (the trailing edge of GATEB) outputs a pulse signal DMY_PT similar to PT only once. In addition, to prepare for an operation after restarting of the STBD, the state-holding section initializing circuit 15 resets all stages of the state-holding section.

After that, the standby state (Standby) again begins. Note that the STBD is still completely stopped.

The effect of the STBD according to the third embodiment of the present invention will be explained with reference to FIG. 18.

Figure 18:
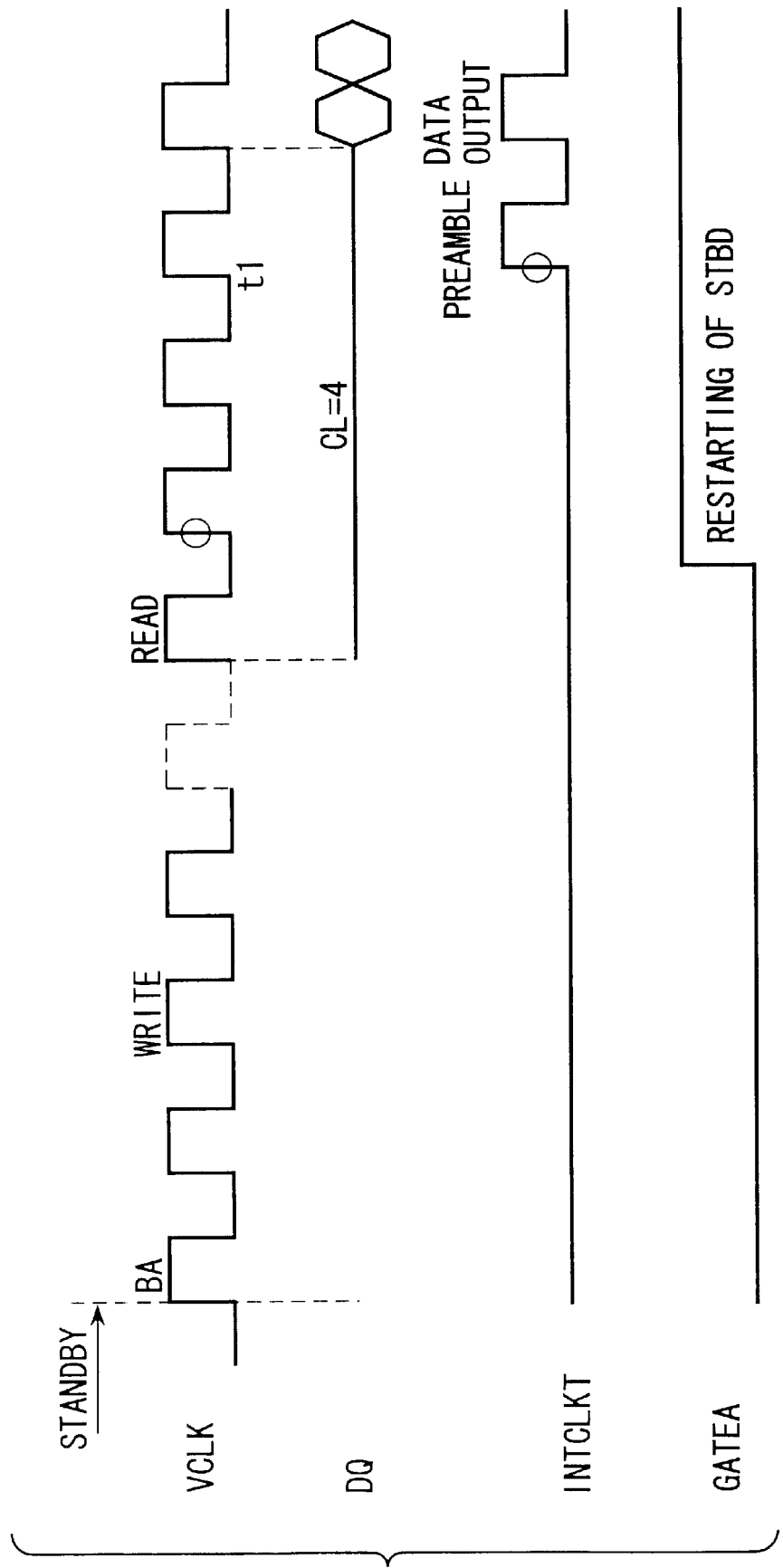
FIG. 18 is a timing chart showing the effect of the STBD shown in FIGS. 15A and 15B.

FIG. 18 shows the main portions of operating waveforms of the STBD shown in FIGS. 15A and 15B.

This proposal is applicable when, e.g., CL=4 or more in a DDR SDRAM.

In Standby mode and Bank Active mode, the STBD is completely stopped. That is, as shown in FIG. 18, even when a command such as a Write command other than a READ command is input in Bank Active mode, the STBD does not start operating, so no electric current is wasted unlike in the conventional proposal.

When a READ command is input and bCOLACTR is output in Bank Active mode, the STBD starts operating, and a synchronous clock INTCLKT is output at preamble t1.

After data is output, the STBD again completely stops. Also, in the third embodiment, only the receiver 11 and the delay monitor 12 are inoperative in Bank Active mode. That is, the STBD consumes an operating current only when data is output by a READ command. This can greatly reduce the current consumption of the whole chip.

5. Fourth Embodiment

Figure 19A:
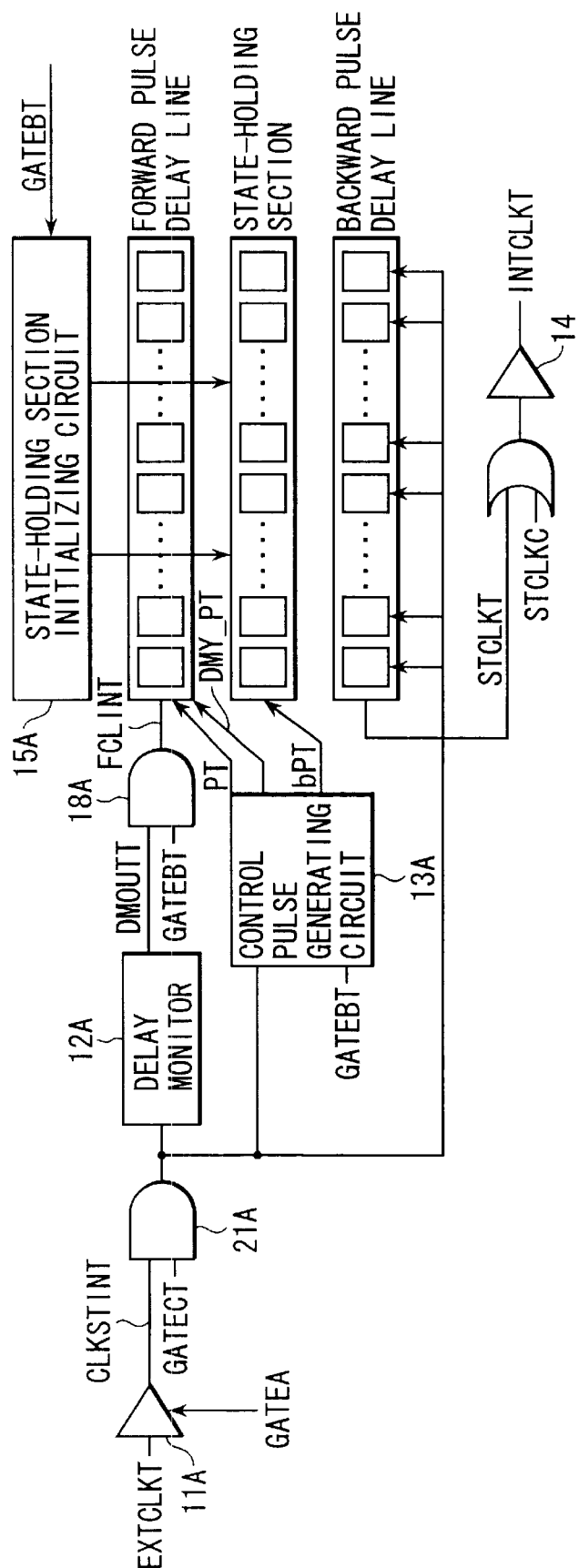

FIGS. 19A, 19B, and 19C are block diagrams showing an STBD according to the fourth embodiment of the present invention.

A double-data-rate SDRAM outputs read data in synchronism with both the leading and trailing edges of an external clock EXTCLKT. Accordingly, a clock synchronous circuit must be configured by an STBD for generating an internal clock synchronizing with the leading edge of EXTCLKT and an STBD for generating an internal clock synchronized with the trailing edge of EXTCLKT.

In a memory such as a double-data-rate SDRAM, an internal clock is sometimes generated on the basis only of an external clock EXTCLKT in synchronism with both the leading and trailing edges of EXTCLKT. In some cases, however, an external clock EXTCLKT and an external clock EXTCLKC whose phase is shifted a half cycle from that of EXTCLKT are given to the memory, and two internal clocks are generated on the basis of these external clocks EXTCLKT and EXTCLKC.

That is, the leading edge of an internal clock INTCLKT is generated on the basis of the leading edge of the external clock EXTCLKT. The trailing edge of the internal clock INTCLKT is generated on the basis of the leading edge of the external clock EXTCLKC. When a control system like this is used, EXTCLKT-STBD and EXTCLKC-STBD are necessary in a double-date-rate SDRAM.

Figure 20:
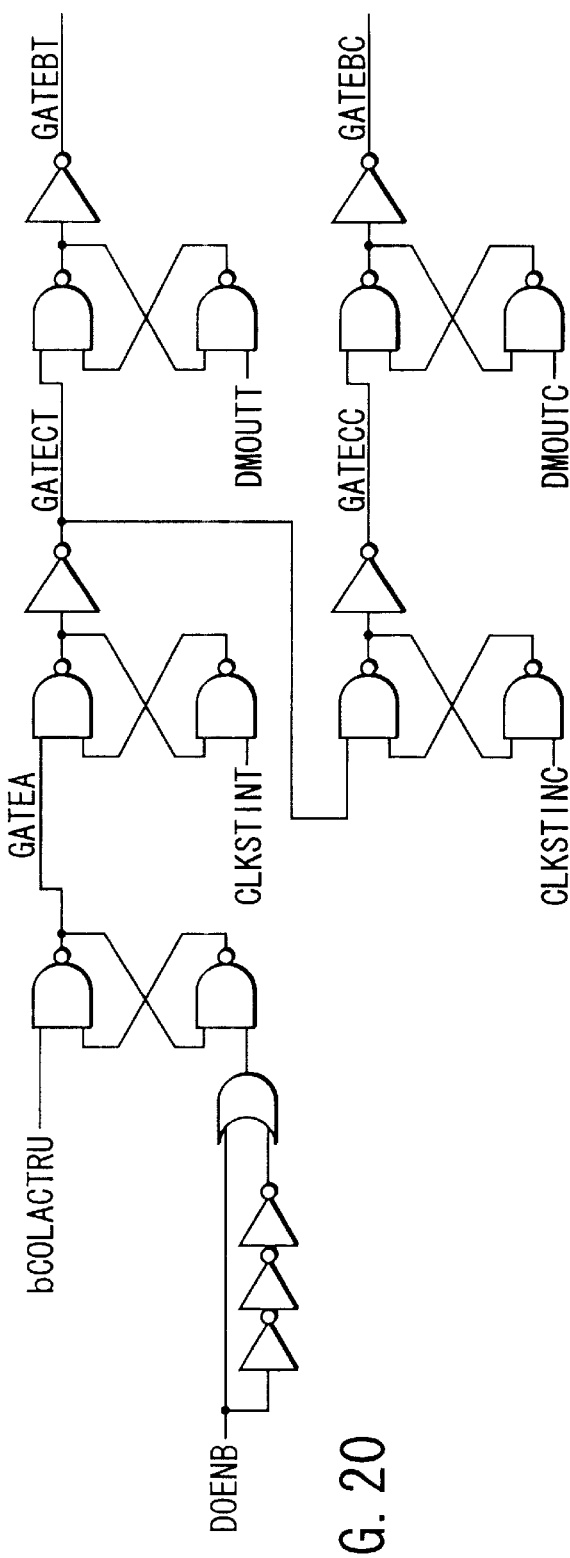
FIG. 20 is a circuit diagram showing a practical example of a gate ABC control circuit.

FIG. 20 shows a practical example of a gate ABC control circuit 20 shown in FIGS. 19A, 19B, and 19C.

In the following description, a T-STBD means an STBD for the external clock EXTCLKT, and a C-STBD means an STBD for the external clock EXTCLKC.

A stop control system for the T-STBD is exactly the same as the system described in the first embodiment described earlier.

A stop control system for the C-STBD will be explained below.

All commands for controlling stop and restarting of the T-STBD are input in synchronism with the "High" edge of EXTCLKT. Therefore, if a period τ changes, the delay relationship between the command and the "High" edge of EXTCLKC changes accordingly. To eliminate this dependence on the period τ, a restarting signal for the C-STBD is delayed a half cycle from GATECT for the T-STBD.

The internal operation of the C-STBD is exactly the same as that of the T-STBD.

6. Fifth Embodiment

Figure 21A:
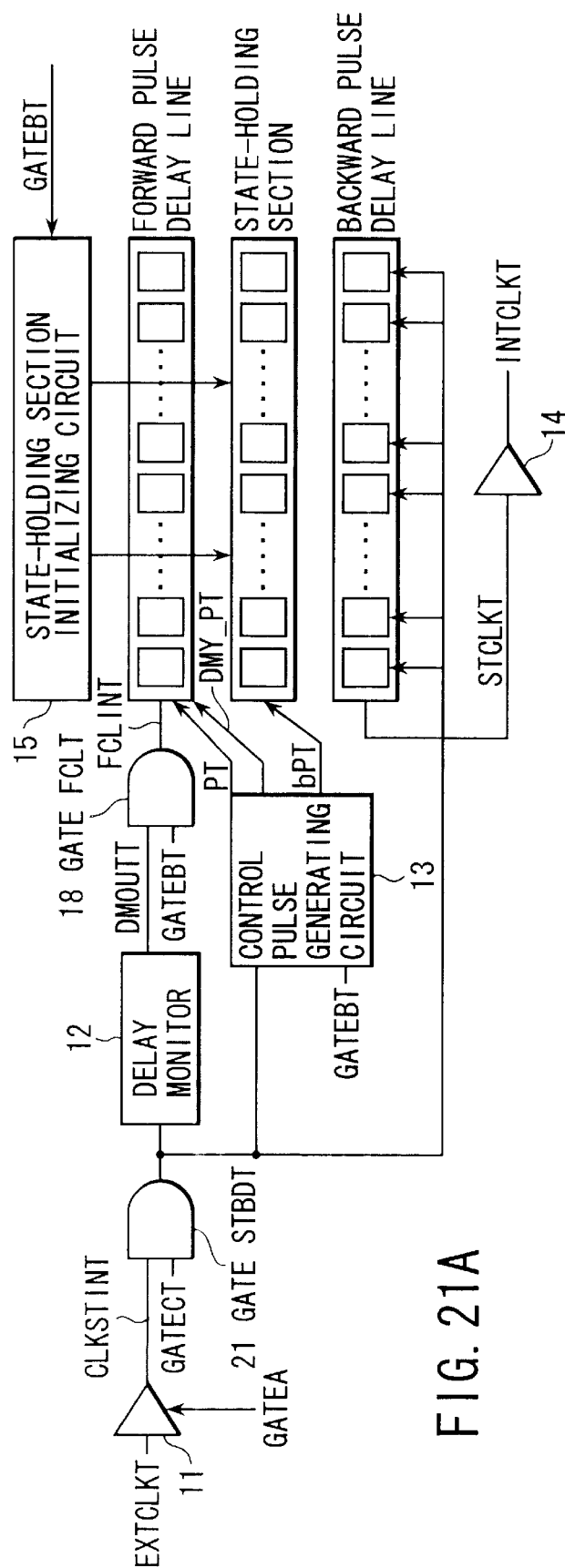
FIGS. 21A and 21B are block diagrams showing an STBD according to the fifth embodiment of the present invention.
Figure 21B:
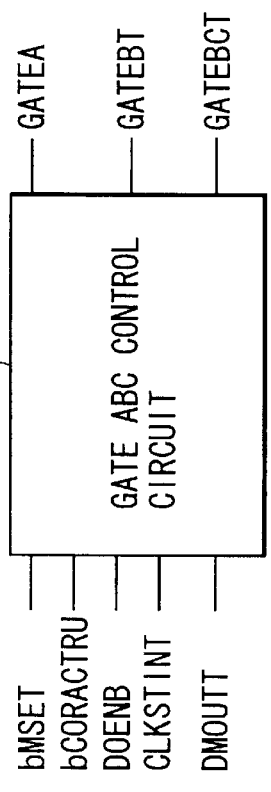

FIGS. 21A and 21B are block diagrams showing an STBD according to the fifth embodiment of the present invention.

The STBD according to this embodiment differs from the STBD (FIG. 1) as a reference example in that two input interrupting gates (a gate STBDT 21 and a gate FCLT 18) for stop control are included, and a control circuit (a gate ABC control circuit 20) for controlling these gates is added.

Figure 22:
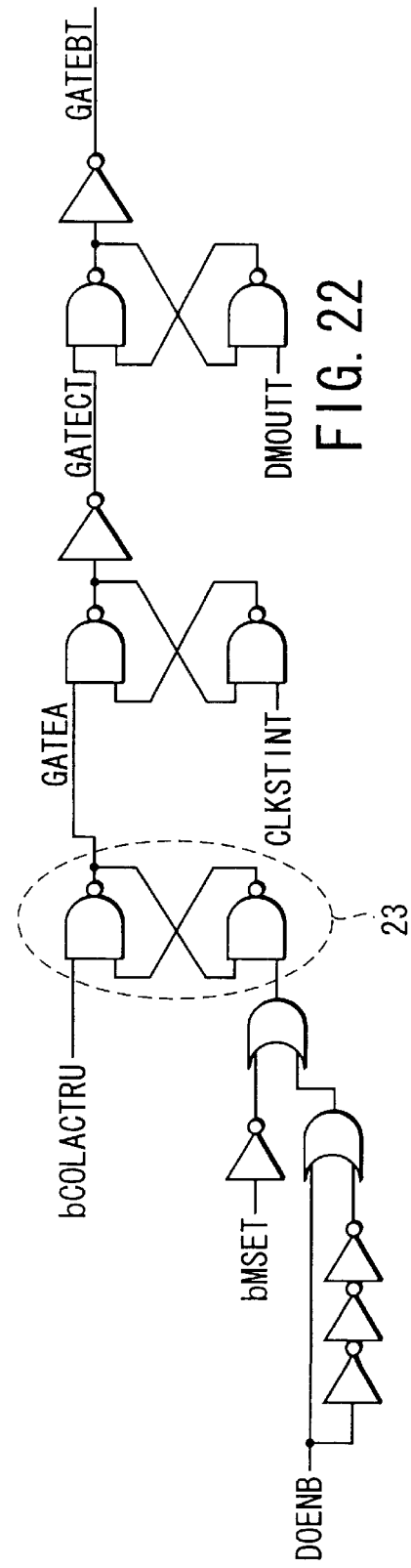
FIG. 22 is a circuit diagram showing a practical example of a gate ABC control circuit.

FIG. 22 shows a practical example of the gate ABC control circuit 20 shown in FIGS. 21A and 21B.

A series of operations of start and stop of this STBD when a Bank Active (BA) command is input after a standby state (Standby) and subsequently a READ command is input will be described below by using a timing chart in FIG. 23.

In this embodiment, signals for determining start and stop of the STBD are DOENB and bCOLACTRU.

In a Fast Cycle RAM (FCRAM), one command is detected by two commands (RDA and LAL) across two consecutive cycles. That is, when a READ operation is to be performed, the RDA command is input in the first cycle, and the LAL command is input in the second cycle. In the case of MODE REGISTER SET, the RDA command is input in the first cycle, and an MRS command is input in the second cycle. Note that the RDA command is input in the first cycle only in these two modes.

An FCRAM is a memory capable of high-speed read, in which access and precharge operations are pipelined to reduce the tRC (random cycle time) of an SDRAM to ½ or less.

In Standby, bCOLACTRU is "High", and DOENB is "Low". Also, an output signal GATEA from the gate ABC control circuit 20 is "Low". Therefore, a receiver 11 which receives this output signal GATEA is stopped. That is, the STBD is completely stopped in Standby.

After that, an RDA (READ) command is input.

When this RDA command is received, bCOLACTRU outputs a "Low" pulse inside the memory. The gate ABC control circuit 20 receives this pulse and changes GATEA to "High". By GATEA↑ (the leading edge of GATEA), the receiver 11 starts operating to supply an external clock EXTCLKT to the internal circuits of the STBD as CLKSTINT.

In order to input only a "High" edge which has fulfilled the period to the internal circuits of the STBD, however, the gate ABC control circuit 20 confirms that CLKSTINT input to the gate STBDT 21 is "Low", and then changes GATECT to "High".

Upon receiving GATECT↑ (the leading edge of GATECT), the gate STBDT 21 becomes operative and supplies CLKSTINT as CLKSTINTD to the internal circuits of the STBD. In addition, to input only a "High" edge which has fulfilled the period to a forward pulse delay line, the gate FCLT 18 is operated after it is detected that DMOUTT input to this gate FCLT 18 is "Low".

Upon receiving GATEBT↑ (the leading edge of GATEBT), a state-holding section initializing circuit 15 releases the initialization of a state-holding section and prepares for a set operation.

Figure 23:
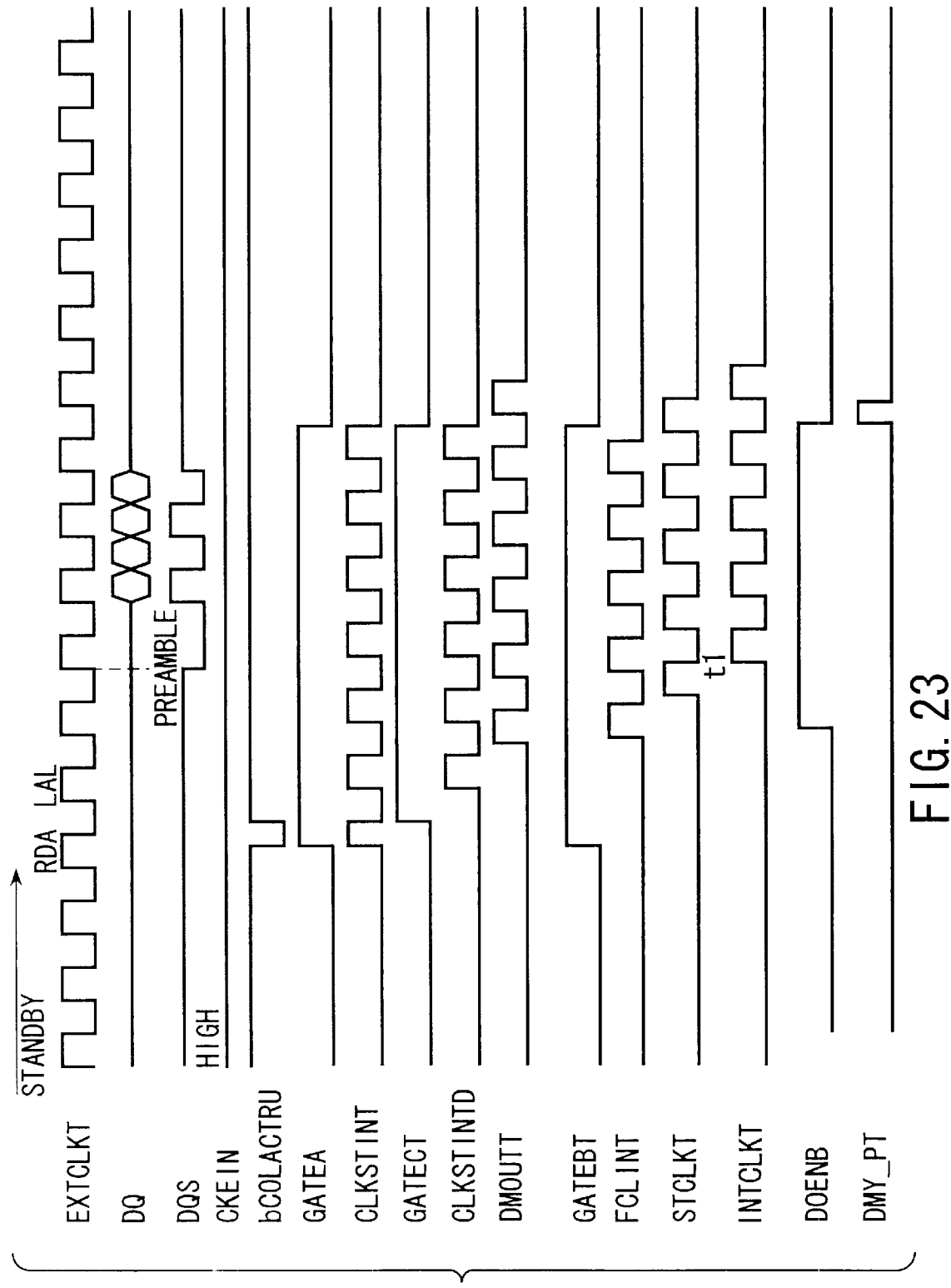
FIG. 23 is a timing chart showing start and stop of the STBD shown in FIGS. 21A and 21B.

Consequently, the internal clock INTCLKT synchronizing with EXTCLKT is output at t1 (FIG. 23).

After that, the output of data is completed, and standby state remains. When the data output is complete, DOENB changes from "High" to "Low". The gate ABC control circuit 20 receives this change, releases the latching of a flip-flop ("23" in FIG. 22), and changes GATEAT, GATEBT, and GATECT to "Low". As a result, all gates stop, and the receiver 11 also stops. That is, the STBD completely stops.

Also, to erase a forward pulse propagating in a control pulse generating circuit 13, GATEBT↓ (the trailing edge of GATEB) outputs a pulse signal DMY_PT similar to PT only once. In addition, to prepare for an operation after restarting of the STBD, the state-holding section initializing circuit 15 resets all stages of the state-holding section. After that, the standby state (Standby) begins. The STBD is still completely stopped.

Even when MSET, i.e., MODE REGISTER SET is input as a command for the second cycle, bCOLACTRU is already output by the command (RDA) in the first cycle, so the STBD starts operating.

The following countermeasure is taken to prevent wasteful operations of the STBD. When MODE REGISTER SET is input, bMSET outputs a "Low" pulse inside the memory. The gate ABC control circuit 20 detects this bMSET and releases the latching of the flip-flop ("23" in FIG. 22) by bCOLACTRU in the first cycle, thereby returning the GATEA signal, which has once risen to "High", to "Low".

As a consequence, the STBD does not operate when the MODE REGISTER SET command is input.

The effect of the STBD according to the fifth embodiment of the present invention will be explained with reference to FIG. 24.

Figure 24:
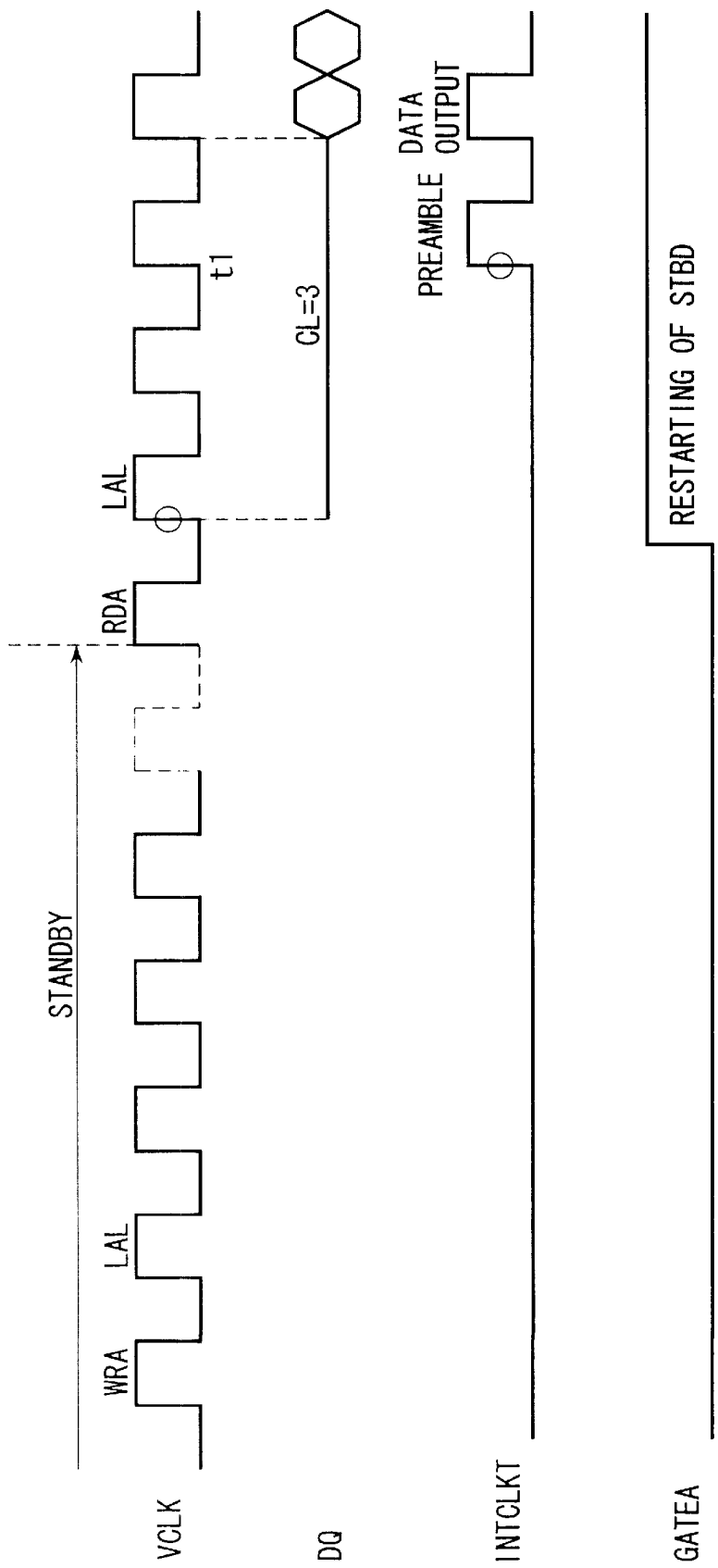
FIG. 24 is a timing chart showing the effect of the STBD shown in FIGS. 21A and 21B.

FIG. 24 shows the main portions of operating waveforms of the STBD shown in FIGS. 21A and 21B.

This proposal is applicable when, e.g., CL=3 in a DDR FCRAM.

In the standby state (Standby), the STBD is completely stopped. That is, as shown in FIG. 24, even when a Write command (WRA+LAL) is input in the standby state, the STBD does not start operating, so no electric current is wasted unlike in the conventional proposal.

When a READ (RDA+LAL) command is input in the standby state (Standby), bCOLACTRU is output, and the STBD becomes operative. Consequently, a synchronous clock INTCLKT is output at preamble t1. After data is output, the STBD again completely stops. That is, the STBD consumes an operating current only when data is output by a READ command. This can greatly reduce the current consumption of the whole chip.

7. Sixth Embodiment

Figure 25A:
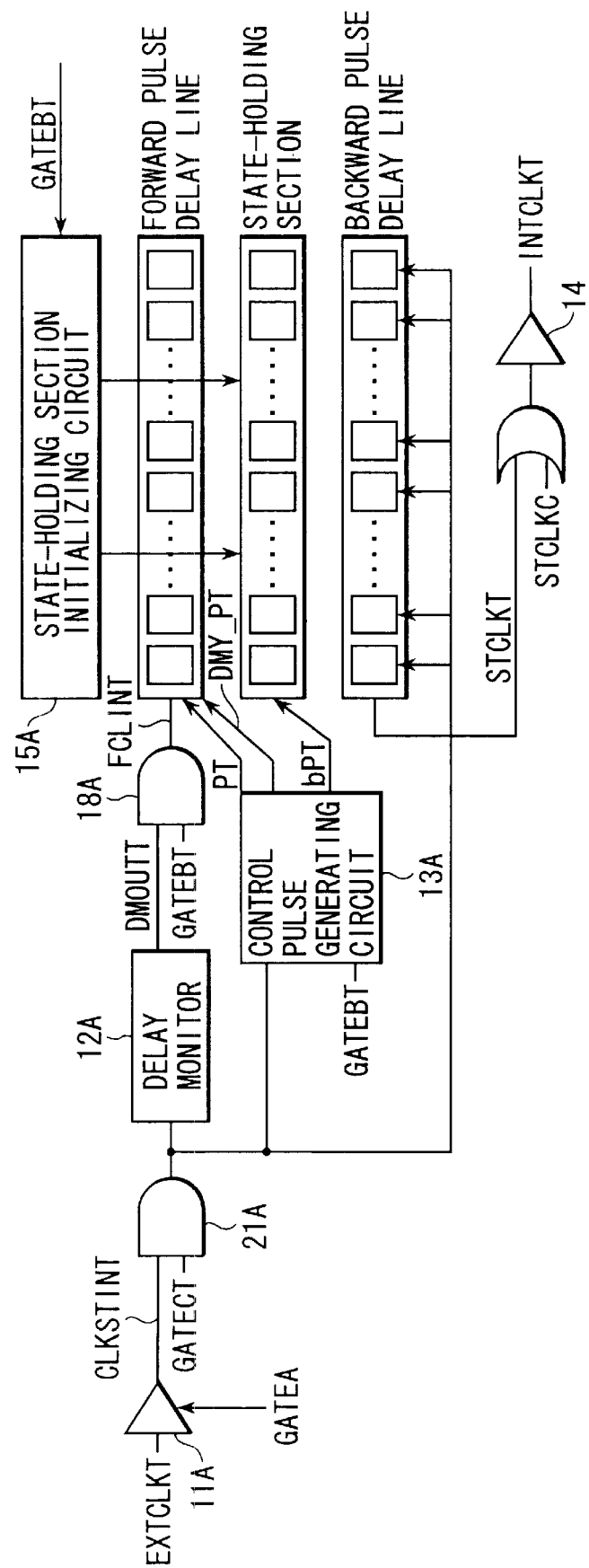
FIGS. 25A, 25B, and 25C are block diagrams showing an STBD according to the sixth embodiment of the present invention.
Figures 25B, 25C:
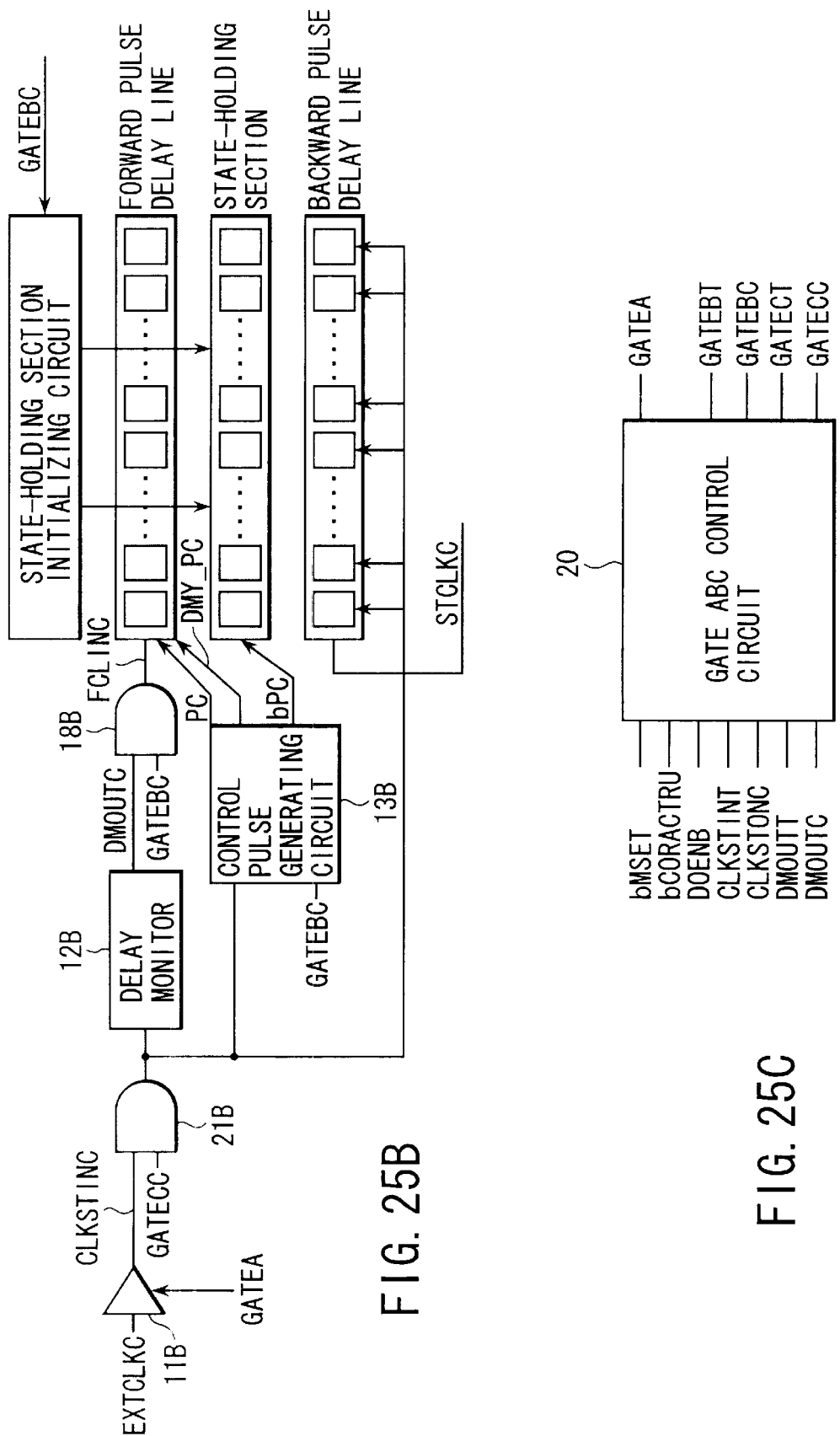

FIGS. 25A, 25B, and 25C are block diagrams showing an STBD according to the sixth embodiment of the present invention.

A double-data-rate FCRAM outputs read data in synchronism with both the leading and trailing edges of an external clock EXTCLKT. Accordingly, a clock synchronous circuit must be configured by an STBD for generating an internal clock synchronized with the leading edge of EXTCLKT and an STBD for generating an internal clock synchronized with the trailing edge of EXTCLKT.

In a memory such as a double-data-rate FCRAM, an internal clock is sometimes generated on the basis only of an external clock EXTCLKT in synchronism with both the leading and trailing edges of EXTCLKT. In some cases, however, an external clock EXTCLKT and an external clock EXTCLKC whose phase is shifted a half cycle from that of EXTCLKT are given to the memory, and two internal clocks are generated on the basis of these external clocks EXTCLKT and EXTCLKC.

That is, the leading edge of an internal clock INTCLKT is generated on the basis of the leading edge of the external clock EXTCLKT. The trailing edge of the internal clock INTCLKT is generated on the basis of the leading edge of the external clock EXTCLKC. When a control system like this is used, EXTCLKT-STBD and EXTCLKC-STBD are necessary in a double-date-rate SDRAM.

Figure 26:
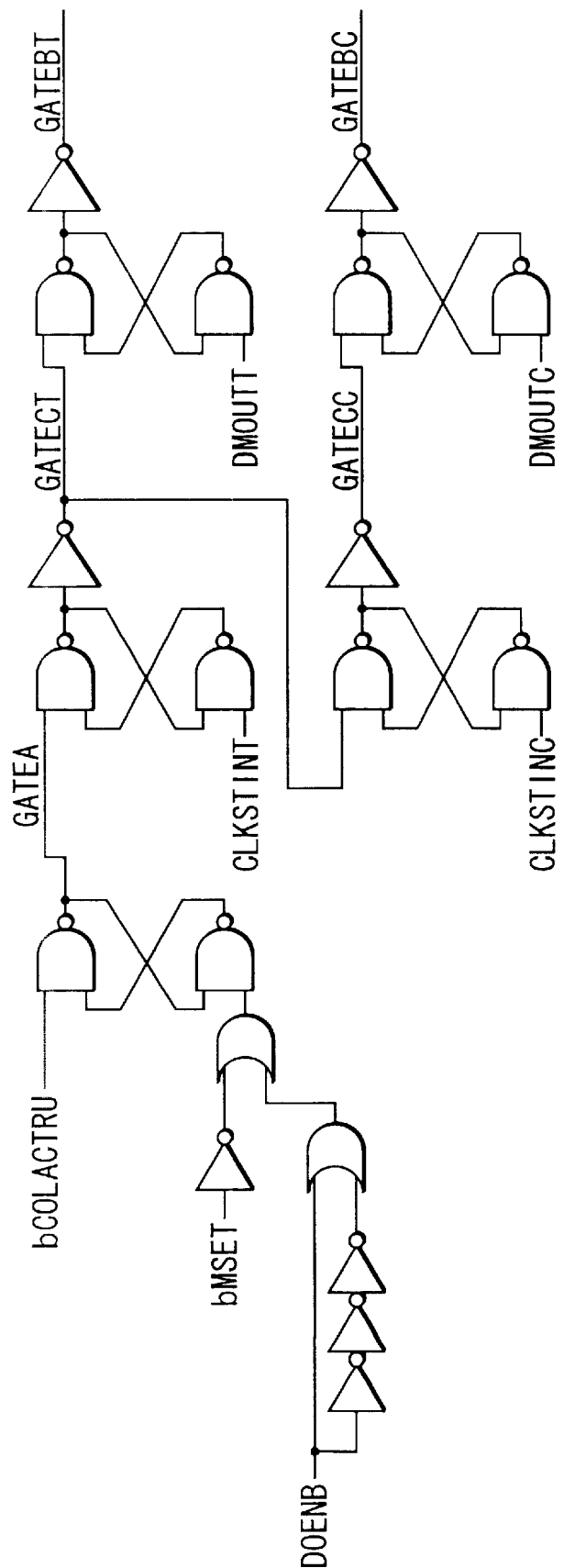
FIG. 26 is a circuit diagram showing a practical example of a gate ABC control circuit.

FIG. 26 shows a practical example of a gate ABC control circuit 20 shown in FIGS. 25A, 25B, and 25C.

In the following description, a T-STBD means an STBD for the external clock EXTCLKT, and a C-STBD means an STBD for the external clock EXTCLKC.

A stop control system for the T-STBD is exactly the same as the system described in the first embodiment described earlier.

A stop control system for the C-STBD will be explained below.

All commands for controlling stop and restarting of the T-STBD are input in synchronism with the "High" edge of EXTCLKT. Therefore, if a period τ changes, the delay relationship between the command and the "High" edge of EXTCLKC changes accordingly. To eliminate this dependence on the period τ, a restarting signal for the C-STBD is delayed a half cycle from GATECT for the T-STBD.

The internal operation of the C-STBD is exactly the same as that of the T-STBD.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A clock synchronous circuit comprising:
   a receiver receiving an external clock;
   a driver outputting an internal clock;
   a delay monitor which receives an output signal of said receiver and monitors a delay time equal to the sum of a delay time of said receiver and a delay time of said driver;
   a first delay line setting a first delay time based on an output signal of said delay monitor;
   a second delay line setting a second delay time equal to the first delay time based on the output signal of said receiver; and
   a controller controlling operations of the receiver and the first and second delay lines,
   said controller comprising:
      a first control circuit enabling said receiver to operation when detecting a bank active command;
      a first input interrupting circuit connecting between said delay monitor and said first delay line;
      a second input interrupting circuit connecting between said receiver and said second delay line; and
      a second control circuit enabling the first and second interrupting circuits to operation when detecting a read command after the bank active command.

2. The clock synchronous circuit according to claim 1, wherein a CAS Latency as a term from detection of the read command to output of a first data is 3 or more.

3. The clock synchronous circuit according to claim 1, wherein said receiver is inoperative in a standby state before detecting the bank active command.

4. The clock synchronous circuit according to claim 1, wherein said first input interrupting circuit comprises a gate circuit inputting the output signal of said delay monitor and an output signal of said second control circuit.

5. The clock synchronous circuit according to claim 1, wherein said second input interrupting circuit comprises a gate circuit inputting the output signal of said receiver and an output signal of said second control circuit.

6. The clock synchronous circuit according to claim 1, wherein said first and second delay lines are inoperative when the first and second input interrupting circuits are inoperative, and said first and second delay lines are operative when the first and second input interrupting circuits are operative.

7. The clock synchronous circuit according to claim 1, wherein said first delay line comprises series-connected first delay units and said second delay line comprises series-connected second delay units.

8. The clock synchronous circuit according to claim 1, further comprising a control pulse generating circuit connecting between said second input interrupting circuit and said first delay line, outputting a pulse signal.

9. The clock synchronous circuit according to claim 1, wherein said second control circuit enables said control pulse generating circuit to operation when said second control circuit detects the read command.

10. The clock synchronous circuit according to claim 1, wherein the first and second input interrupting circuits hold an inoperative state when said second control circuit detects a write command after the bank active command.

11. The clock synchronous circuit according to claim 1, wherein said driver is a part of a data output circuit.

12. A clock synchronous circuit comprising:
a first clock synchronous circuit comprising the clock synchronous circuit according to claim 1, generating a first internal clock based on a first external clock; and
a second clock synchronous circuit comprising the clock synchronous circuit according to claim 1, generating a second internal clock based on a second external clock;
wherein the first external clock is shifted a half cycle from the second external clock.

13. A semiconductor memory comprising:
the clock synchronous circuit according to claim 1; and
a data output circuit controlling by the internal clock outputting from said clock synchronous circuit;
wherein said data output circuit outputs data in synchronism with the internal clock in a read mode.

14. The semiconductor memory according to claim 13, wherein said first input interrupting circuit renders said first delay line operative in the read mode, and renders said first delay line inoperative in modes other than the read mode.

15. The semiconductor memory according to claim 13, wherein said second input interrupting circuit renders said second delay line operative in the read mode, and renders said second delay line inoperative in modes other than the read mode.

16. The semiconductor memory according to claim 13, wherein said data output circuit outputs the data in synchronism with the leading and trailing edges of the external clock.

17. The semiconductor memory according to claim 13, wherein said semiconductor memory is a double-data-rate DRAM.

18. The semiconductor memory according to claim 13, wherein a CAS Latency as a number of the external clock from detection of the read command to output of a first data is 3 or more.

19. A clock synchronous circuit comprising:
a receiver receiving an external clock;
a driver outputting an internal clock;
a delay monitor which receives an output signal of said receiver and monitors a delay time equal to the sum of a delay time of said receiver and a delay time of said driver;
a first delay line setting a first delay time based on an output signal of said delay monitor;
a second delay line setting a second delay time equal to the first delay time based on the output signal of said receiver; and
a controller controlling operations of the receiver and the first and second delay lines,
said controller comprising:
a first input interrupting circuit connecting between said delay monitor and said first delay line;
a second input interrupting circuit connecting between said receiver and said second delay line, said delay monitor receives an output signal of said second input interrupting circuit; and
a control circuit enabling the receiver and the first and second interrupting circuits to operation when detecting a read command after a bank active command.

20. The clock synchronous circuit according to claim 19, wherein a CAS Latency as a term from detection of the read command to output of a first data is 4 or more.

21. The clock synchronous circuit according to claim 19, wherein said receiver is inoperative in a standby state and a bank active state before detecting the read command.

22. The clock synchronous circuit according to claim 19, wherein said first input interrupting circuit comprises a gate circuit inputting the output signal of said delay monitor and an output signal of said control circuit.

23. The clock synchronous circuit according to claim 19, wherein said second input interrupting circuit comprises a gate circuit inputting the output signal of said receiver and an output signal of said control circuit.

24. The clock synchronous circuit according to claim 19, wherein said first and second delay lines are inoperative when the first and second input interrupting circuits are inoperative, and said first and second delay lines are operative when the first and second input interrupting circuits are operative.

25. The clock synchronous circuit according to claim 19, wherein said first delay line comprises series-connected first delay units and said second delay line comprises series-connected second delay units.

26. The clock synchronous circuit according to claim 19, further comprising a control pulse generating circuit connecting between said second input interrupting circuit and said first delay line, outputting a pulse signal.

27. The clock synchronous circuit according to claim 26, wherein said control circuit enables said control pulse generating circuit to operation when said control circuit detects the read command.

28. The clock synchronous circuit according to claim 19, wherein the first and second input interrupting circuits hold an inoperative state when said control circuit detects a write command after the bank active command.

29. The clock synchronous circuit according to claim 19, wherein said driver is a part of a data output circuit.

30. A clock synchronous circuit comprising:
a first clock synchronous circuit comprising the clock synchronous circuit according to claim 19, generating a first internal clock based on a first external clock; and
a second clock synchronous circuit comprising the clock synchronous circuit according to claim 19, generating a second internal clock based on a second external clock;
wherein the first external clock is shifted a half cycle from the second external clock.

31. A semiconductor memory comprising:
the clock synchronous circuit according to claim 19; and
a data output circuit controlling by the internal clock outputting from said clock synchronous circuit;
wherein said data output circuit outputs data in synchronism with the internal clock in a read mode.

32. The semiconductor memory according to claim 31, wherein said first input interrupting circuit renders said first delay line operative in the read mode, and renders said first delay line inoperative in modes other than the read mode.

33. The semiconductor memory according to claim 31, wherein said second input interrupting circuit renders said second delay line operative in the read mode, and renders said second delay line inoperative in modes other than the read mode.

34. The semiconductor memory according to claim 31, wherein said data output circuit outputs the data in synchronism with the leading and trailing edges of the external clock.

35. The semiconductor memory according to claim 31, wherein said semiconductor memory is a double-data-rate DRAM.

36. The semiconductor memory according to claim 31, wherein a CAS Latency as a number of the external clock from detection of the read command to output of a first data is 4 or more.

37. A clock synchronous circuit comprising:
a receiver receiving an external clock;
a driver outputting an internal clock;
a delay monitor which receives an output signal of said receiver and monitors a delay time equal to the sum of a delay time of said receiver and a delay time of said driver;
a first delay line setting a first delay time based on an output signal of said delay monitor;
a second delay line setting a second delay time equal to the first delay time based on the output signal of said receiver; and
a controller controlling operations of the receiver and the first and second delay lines,
said controller comprising:
a first input interrupting circuit connecting between said delay monitor and said first delay line;
a second input interrupting circuit connecting between said receiver and said second delay line, said delay monitor receives an output signal of said second input interrupting circuit; and
a control circuit enabling the receiver and the first and second interrupting circuits to operation when detecting two consecutive special commands as a read command after a standby state.

38. The clock synchronous circuit according to claim 37, wherein the special commands comprise the read command and a CAS Latency as a term from detection of the special commands to output of a first data is 3 or more.

39. The clock synchronous circuit according to claim 37, wherein said control circuit disabling the receiver and the first and second interrupting circuits to operation when said control circuit detects only one of the special commands.

40. The clock synchronous circuit according to claim 37, wherein said receiver is inoperative in the standby state before detecting the read command.

41. The clock synchronous circuit according to claim 37, wherein said first input interrupting circuit comprises a gate circuit inputting the output signal of said delay monitor and an output signal of said control circuit.

42. The clock synchronous circuit according to claim 37, wherein said second input interrupting circuit comprises a gate circuit inputting the output signal of said receiver and an output signal of said control circuit.

43. The clock synchronous circuit according to claim 37, wherein said first and second delay lines are inoperative when the first and second input interrupting circuits are inoperative, and said first and second delay lines are operative when the first and second input interrupting circuits are operative.

44. The clock synchronous circuit according to claim 37, wherein said first delay line comprises series-connected first delay units and said second delay line comprises series-connected second delay units.

45. The clock synchronous circuit according to claim 37, further comprising a control pulse generating circuit connecting between said second input interrupting circuit and said first delay line, outputting a pulse signal.

46. The clock synchronous circuit according to claim 45, wherein said control circuit enables said control pulse generating circuit to operation when said control circuit detects the read command.

47. The clock synchronous circuit according to claim 37, wherein the first and second input interrupting circuits hold an inoperative state when said control circuit detects a write command.

48. The clock synchronous circuit according to claim 37, wherein said driver is a part of a data output circuit.

49. A clock synchronous circuit comprising:
a first clock synchronous circuit comprising the clock synchronous circuit according to claim 37, generating a first internal clock based on a first external clock; and
a second clock synchronous circuit comprising the clock synchronous circuit according to claim 37, generating a second internal clock based on a second external clock;
wherein the first external clock is shifted a half cycle from the second external clock.

50. A semiconductor memory comprising:
the clock synchronous circuit according to claim 37; and
a data output circuit controlling by the internal clock outputting from said clock synchronous circuit;
wherein said data output circuit outputs data in synchronism with the internal clock in a read mode.

51. The semiconductor memory according to claim 50, wherein said first input interrupting circuit renders said first delay line operative in the read mode, and renders said first delay line inoperative in modes other than the read mode.

52. The semiconductor memory according to claim 50, wherein said second input interrupting circuit renders said second delay line operative in the read mode, and renders said second delay line inoperative in modes other than the read mode.

53. The semiconductor memory according to claim 50, wherein said data output circuit outputs the data in synchronism with the leading and trailing edges of the external clock.

54. The semiconductor memory according to claim 50, wherein said semiconductor memory is a double-data-rate FCRAM.

55. The semiconductor memory according to claim 50, wherein said semiconductor memory is a FCRAM and a CAS Latency as a number of the external clock from detection of the read command to output of a first data is 3 or more.

* * * * *